US011639310B2

(12) United States Patent
Guo et al.

(10) Patent No.: US 11,639,310 B2
(45) Date of Patent: May 2, 2023

(54) GLASS-BASED ARTICLES WITH IMPROVED FRACTURE RESISTANCE

(71) Applicant: CORNING INCORPORATED, Corning, NY (US)

(72) Inventors: Xiaoju Guo, Painted Post, NY (US); Jennifer Lynn Hunt, Corning, NY (US); Peter Joseph Lezzi, Corning, NY (US); Rostislav Vatchev Roussev, Painted Post, NY (US); Charlene Marie Smith, Corning, NY (US); Ross Johnson Stewart, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 24 days.

(21) Appl. No.: 17/485,911

(22) Filed: Sep. 27, 2021

(65) Prior Publication Data

US 2022/0009829 A1 Jan. 13, 2022

Related U.S. Application Data

(63) Continuation of application No. 16/565,899, filed on Sep. 10, 2019, now Pat. No. 11,130,705.

(60) Provisional application No. 62/729,735, filed on Sep. 11, 2018.

(51) Int. Cl.
    *C03C 21/00* (2006.01)
    *C03C 3/087* (2006.01)
    *H05K 7/14* (2006.01)

(52) U.S. Cl.
    CPC ............ *C03C 21/002* (2013.01); *C03C 3/087* (2013.01); *H05K 7/14* (2013.01)

(58) Field of Classification Search
    None
    See application file for complete search history.

(56) References Cited

U.S. PATENT DOCUMENTS

| 8,854,623 | B2 | 10/2014 | Fontaine et al. |
| 9,604,876 | B2 | 3/2017 | Gy et al. |
| 10,144,670 | B2 | 12/2018 | Akatsuka et al. |
| 10,239,784 | B2 | 3/2019 | Oram et al. |
| 11,130,705 | B2 * | 9/2021 | Guo .................... C03C 10/0027 |
| 2015/0368148 | A1 | 12/2015 | Duffy et al. |
| 2016/0102011 | A1 | 4/2016 | Hu et al. |
| 2016/0102014 | A1 | 4/2016 | Hu et al. |
| 2016/0376186 | A1 | 12/2016 | Gross |
| 2017/0313622 | A1 | 11/2017 | Ogami et al. |
| 2018/0002223 | A1 | 1/2018 | Hu et al. |
| 2018/0127304 | A1 | 5/2018 | Gross et al. |
| 2018/0327304 | A1 | 11/2018 | Murayama et al. |
| 2019/0300422 | A1 | 10/2019 | Guo et al. |
| 2019/0375679 | A1 | 12/2019 | Gross et al. |
| 2021/0387898 | A1 | 12/2021 | Gross |

FOREIGN PATENT DOCUMENTS

| CN | 103097319 A | 5/2013 |
| CN | 103842311 A | 6/2014 |
| CN | 105753314 A | 7/2016 |
| CN | 106866000 A | 6/2017 |
| CN | 107810110 A | 3/2018 |
| CN | 108473370 A | 8/2018 |
| WO | 2013/051514 A1 | 4/2013 |
| WO | 2016/185934 A1 | 11/2016 |
| WO | 2018/056168 A1 | 3/2018 |

OTHER PUBLICATIONS

Chinese Patent Application No. 201980073996.X, Office Action dated Sep. 8, 2022, 4 pages (English Translation only), Chinese Patent Office.
Bouyne et al; "Fragmentation of Thin Chemically Tempered Glass Plates"; Glass Technol., 43C; pp. 300-302; (2002).
Click et al; "Glass-Ceramic Articles With Increased Resistance to Fracture and Methods for Making the Same"; filed as U.S. Appl. No. 16/512,953, filed Jul. 16, 2019; 51 Pages.
Fracture Behavior and Intrinsic Strength of FPD Substrates. Allaire et al. Corning TIP 203 (Year: 2004).
Gehrke et al; "Effect of Corrosive Media on Crack Growth of Model Glasses and Commercial Silicate Glasses," Glastech. Ber., 63 255-265 (1990).
Gehrke et al.; "Fatigue Limit and Crack Arrest in Alkali-Containing Silicate Glasses," J. Mater. Sci., 26 5445-5455 (1991).
Guin et al; "Crack Growth Threshold in Soda Lime Silicate Glass: Role of Hold-Time," J. Non-Cryst Solids, 316 12-20 (2003).
Gulati; "Frangibility of Tempered Soda-Lime Glass Sheet"; Glass Processing Days, pp. 72-76; (1997).
Hirao et al; "Microhardness of Si02 Glass in Various Environments," J. Am Ceram. Soc 70 [7] (1987) 497-502.
International Search Report and Writien Opinion of the European International Searching Authority; PCT/US2019/050619; dated Nov. 22, 2019; 13 Pgs.
Wiederhorn et al; "Crack Growth in Sodalime Silicate Glass Near the Static Fatigue Limit," J. Am. Ceram. Soc., 85 [9] 2287-2292 (2002).
Wiederhorn et al; "Stress Corrosion and Static Fatigue of Glass," J. Am. Ceram. Soc., 53 [10] 543-548 (1970).
Wiederhorn, "Influence of Water Vapor on Crack Propagation in Soda-Lime Glass," J. Am. Ceram. Soc., 50 [8] 407-414 (1967).

* cited by examiner

*Primary Examiner* — David Sample
(74) *Attorney, Agent, or Firm* — Travis B. Gasa

(57) ABSTRACT

Glass-based articles are provided that exhibit improved fracture resistance. The relationships between properties attributable to the glass composition and stress profile of the glass-based articles are provided that indicate improved fracture resistance.

21 Claims, 11 Drawing Sheets

GLASS-BASED ARTICLES WITH IMPROVED FRACTURE RESISTANCE

CROSS-REFERENCE TO RELATED APPLICATIONS

This application is a continuation of U.S. patent application Ser. No. 16/565,899 filed on Sep. 10, 2019, which claims the benefit of priority under 35 U.S.C. § 119 of U.S. Provisional Application Ser. No. 62/729,735 filed on Sep. 11, 2018 the content of each of which is relied upon and incorporated herein by reference in their entirety.

BACKGROUND

Field

The present specification generally relates to glass-based articles suitable for use as cover glass for electronic devices.

Technical Background

The mobile nature of portable devices, such as smart phones, tablets, portable media players, personal computers, and cameras, makes these devices particularly vulnerable to accidental dropping on hard surfaces, such as the ground. These devices typically incorporate cover glasses, which may become damaged upon impact with hard surfaces. In many of these devices, the cover glasses function as display covers, and may incorporate touch functionality, such that use of the devices is negatively impacted when the cover glasses are damaged.

There are two major failure modes of cover glass when the associated portable device is dropped on a hard surface. One of the modes is flexure failure, which is caused by bending of the glass when the device is subjected to dynamic load from impact with the hard surface. The other mode is sharp contact failure, which is caused by introduction of damage to the glass surface. Impact of the glass with rough hard surfaces, such as asphalt, granite, etc., can result in sharp indentations in the glass surface. These indentations become failure sites in the glass surface from which cracks may develop and propagate.

Glass can be made more resistant to flexure failure by the ion-exchange technique, which involves inducing compressive stress in the glass surface. However, the ion-exchanged glass will still be vulnerable to dynamic sharp contact, owing to the high stress concentration caused by local indentations in the glass from the sharp contact. Additionally, ion-exchanged glass articles can exhibit an undesirable fracture condition that results in a high number of fragments and/or energized fragments due to stored energy in the glass.

It has been a continuous effort for glass makers and handheld device manufacturers to improve the resistance of handheld devices to sharp contact failure. Solutions range from coatings on the cover glass to bezels that prevent the cover glass from impacting the hard surface directly when the device drops on the hard surface. However, due to the constraints of aesthetic and functional requirements, it is very difficult to completely prevent the cover glass from impacting the hard surface.

It is also desirable that portable devices be as thin as possible. Accordingly, in addition to strength, it is also desired that glasses to be used as cover glass in portable devices be made as thin as possible. Thus, in addition to increasing the strength of the cover glass, it is also desirable for the glass to have mechanical characteristics that allow it to be formed by processes that are capable of making thin glass articles, such as thin glass sheets.

Accordingly, a need exists for glasses that can be strengthened, such as by ion exchange, and that does not exhibit a high number of fragments when fractured.

SUMMARY

According to aspect (1), a glass-based article is provided. The glass-based article comprises: a first surface; a second surface; and a stress profile having a first compressive region extending from a first surface to a first depth of compression $DOC_1$, a second compressive region extending from a second surface to a second depth of compression $DOC_2$, and a tensile region extending from $DOC_1$ to $DOC_2$. The tensile region has a tensile stress factor $K_T$ greater than or equal to 1.31 MPa·$\sqrt{(m)}$ and less than 1.8·$K_{IC}$, wherein $K_{IC}$ is the fracture toughness of a glass-based substrate having the same composition as the center of the glass-based article.

According to aspect (2), the glass-based article of aspect (1) is provided, wherein $K_T$ is greater than or equal to 1.41 MPa·$\sqrt{(m)}$.

According to aspect (3), the glass-based article of aspect (1) or (2) is provided, wherein $K_T$ is greater than or equal to 2.0 MPa·$\sqrt{(m)}$.

According to aspect (4), the glass-based article of any of aspects (1) to (3) is provided, wherein $K_T$ is less than or equal to 1.781·$K_{IC}$.

According to aspect (5), the glass-based article of any of aspects (1) to (4) is provided, wherein $K_{IC}$ is greater than or equal to 0.67 MPa·$\sqrt{(m)}$.

According to aspect (6), the glass-based article of any of aspects (1) to (5) is provided, wherein $K_{IC}$ is greater than or equal to 1.3 MPa·$\sqrt{(m)}$.

According to aspect (7), the glass-based article of any of aspects (1) to (6) is provided, comprising an alkali aluminosilicate.

According to aspect (8), the glass-based article of any of aspects (1) to (7) is provided, wherein $DOC_1 = DOC_2$, as measured from the first and second surfaces, respectively.

According to aspect (9), the glass-based article of any of aspects (1) to (8) is provided, wherein the glass-based article is non-frangible.

According to aspect (10), a consumer electronic product is provided. The consumer electronic product, comprising: a housing comprising a front surface, a back surface and side surfaces; electrical components at least partially within the housing, the electrical components comprising at least a controller, a memory, and a display, the display at or adjacent the front surface of the housing; and a cover substrate disposed over the display. A portion of at least one of the housing or the cover substrate comprises the glass-based article of any of aspects (1) to (9).

According to aspect (11), a glass-based article is provided. The glass-based article: a surface; and a stress profile having a compressive region extending from a surface to a depth of compression DOC, and a tensile region. The tensile region has a tensile stress factor $K_T$ greater than or equal to 1.31 MPa·$\sqrt{(m)}$ and less than or equal to $K_T^{limit}$, where $K_T^{limit}$ is defined by:

$$K_T^{limit} = 1.716 \cdot K_{IC} \sqrt{1 + 2.263 \frac{DOC}{t}}$$

wherein $K_{IC}$ is the fracture toughness of a glass-based substrate having the same composition is the center of the glass-based article, and t is the thickness of the glass-based article.

According to aspect (12), the glass-based article of aspect (11) is provided, wherein $K_T$ is greater than or equal to 1.41 MPa·√(m).

According to aspect (13), the glass-based article of aspect (11) or (12) is provided, wherein $K_T$ is greater than or equal to 2.0 MPa·√(m).

According to aspect (14), the glass-based article of any of aspects (11) to (13) is provided, wherein $$\frac{DOC}{t}$$

is greater 0.12.

According to aspect (15), the glass-based article of any of aspects (11) to (14) is provided, wherein $$\frac{DOC}{t}$$

is greater than 0.18.

According to aspect (16), the glass-based article of any of aspects (11) to (15) is provided, wherein $K_{IC}$ is greater than or equal to 0.67 MPa·√(m).

According to aspect (17), the glass-based article of any of aspects (11) to (16) is provided, wherein $K_{IC}$ is greater than or equal to 1.3 MPa·√(m).

According to aspect (18), the glass-based article of any of aspects (11) to (17) is provided, comprising an alkali aluminosilicate.

According to aspect (19), the glass-based article of any of aspects (11) to (18) is provided, wherein the glass-based article is non-frangible.

According to aspect (20), a consumer electronic product is provided. The consumer electronic product, comprising: a housing comprising a front surface, a back surface and side surfaces; electrical components at least partially within the housing, the electrical components comprising at least a controller, a memory, and a display, the display at or adjacent the front surface of the housing; and a cover substrate disposed over the display. A portion of at least one of the housing or the cover substrate comprises the glass-based article of any of aspects (11) to (19).

According to aspect (21), a glass-based article is provided. The glass-based article, comprising: a first surface; a second surface; and a stress profile having a first compressive region extending from a first surface to a first depth of compression $DOC_1$, a second compressive region extending from a second surface to a second depth of compression $DOC_2$, and a tensile region extending from $DOC_1$ to $DOC_2$. The tensile region has a tensile stress factor $K_T$ greater than or equal to 1.31 MPa·√(m) and less than or equal to $K_T^{limit}$, where $K_T^{limit}$ is defined by $$K_T^{limit} = 2.504 \cdot K_{IC} \sqrt{1 - 0.531 \frac{|DOC_1 - DOC_2|}{t}}$$

wherein $K_{IC}$ is the fracture toughness of a glass-based substrate having the same composition as the center of the glass-based article, t is the thickness of the glass-based article, and the $DOC_1$ and the $DOC_2$ are measured from the first surface.

According to aspect (22), the glass-based article of aspect (21) is provided, wherein $K_T$ is greater than or equal to 1.41 MPa·√(m).

According to aspect (23), the glass-based article of aspect (21) or (22) is provided, wherein $K_T$ is greater than or equal to 2.0 MPa·√(m).

According to aspect (24), the glass-based article of any of aspects (21) to (23) is provided, wherein $K_T$ is less than or equal to $0.95 \cdot K_T^{limit}$.

According to aspect (25), the glass-based article of any of aspects (21) to (24) is provided, wherein $K_T$ is less than or equal to $0.85 \cdot K_T^{limit}$.

According to aspect (26), the glass-based article of any of aspects (21) to (25) is provided, wherein $K_{IC}$ is greater than or equal to 0.67 MPa·√(m).

According to aspect (27), the glass-based article of any of aspects (21) to (26) is provided, wherein $K_{IC}$ is greater than or equal to 1.3 MPa·√(m).

According to aspect (28), the glass-based article of any of aspects (21) to (27) is provided, comprising an alkali aluminosilicate.

According to aspect (29), the glass-based article of any of aspects (21) to (28) is provided, wherein $DOC_1 = t - DOC_2$.

According to aspect (30), the glass-based article of any of aspects (21) to (29) is provided, wherein the glass-based article is non-frangible.

According to aspect (31), a consumer electronic product is provided. The consumer electronic product, comprising: a housing comprising a front surface, a back surface and side surfaces; electrical components at least partially within the housing, the electrical components comprising at least a controller, a memory, and a display, the display at or adjacent the front surface of the housing; and a cover substrate disposed over the display. A portion of at least one of the housing or the cover substrate comprises the glass-based article of any of aspects (21) to (30).

According to aspect (32), a glass-based article is provided. The glass-based article, comprising: a surface; and a stress profile having a compressive region extending from a surface to a depth of compression DOC, and a tensile region. The compressive region has a compressive-stress factor $K_{CS}$, the tensile region has a tensile stress factor $K_T$ greater than or equal to 1.31 MPa·√m), and:

$$\frac{K_T^2}{K_{IC}^2} + \frac{1}{28.5} \frac{K_{CS}^2}{K_{IC}^2} \leq 4.45$$

wherein $K_{IC}$ is the fracture toughness of a glass-based substrate having the same composition as the center of the glass-based article.

According to aspect (33), the glass-based article of aspect (32) is provided, wherein:

$$\frac{K_T^2}{K_{IC}^2} + \frac{1}{28.5} \frac{K_{CS}^2}{K_{IC}^2} \leq 4.1.$$

According to aspect (34), the glass-based article of aspect (32) or (33) is provided, wherein:

$$\frac{K_T^2}{K_{IC}^2} + \frac{1}{28.5}\frac{K_{CS}^2}{K_{IC}^2} \leq 3.8.$$

According to aspect (35), the glass-based article of any of aspects (32) to (34) is provided, wherein $K_T$ is greater than or equal to 1.41 MPa·$\sqrt{\text{m}}$).

According to aspect (36), the glass-based article of any of aspects (32) to (35) is provided, wherein $K_T$ is greater than or equal to 2.0 Mpa·$\sqrt{\text{m}}$).

According to aspect (37), the glass-based article of any of aspects (32) to (36) is provided, comprising an alkali aluminosilicate.

According to aspect (38), the glass-based article of any of aspects (32) to (37) is provided, wherein the glass-based article is non-frangible.

According to aspect (39), a consumer electronic product is provided. The consumer electronic product, comprising: a housing comprising a front surface, a back surface and side surfaces; electrical components at least partially within the housing, the electrical components comprising at least a controller, a memory, and a display, the display at or adjacent the front surface of the housing; and a cover substrate disposed over the display. A portion of at least one of the housing or the cover substrate comprises the glass-based article of any of aspects (32) to (38).

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Reference will now be made in detail to glass-based articles according to various embodiments. As utilized herein, "glass-based" indicates an article that includes a glass, such as glass or glass-ceramic compositions, wherein a glass-ceramic includes one or more crystalline phases and a residual glass phase. In general, a "glass-based substrate" refers to an article prior to ion exchange, and a "glass-based article" refers to an ion exchanged article.

The glass-based articles exhibit improved drop performance while also not exhibiting a fracture condition that produces a large number of fragments. This quality makes the glass-based articles particularly suitable for use in electronic devices, particularly mobile electronic devices that may be subjected to conditions causing the glass-based article to fracture during use. The glass-based articles include a compressive stress layer extending from a surface of the glass-based article to a depth of compression.

The effect of the particular combination of properties attributable to the glass composition and the properties attributable to the stress profile of the glass-based articles may be considered as a whole when selecting glass-based articles for use in electronic devices. Stated differently the behavior of ion exchanged glass-based articles may be attributed to factors associated with the composition of the glass-based substrate subjected to ion exchange to form the glass-based article and also to factors attributable to the stress profile produced by the ion exchange process.

As the degree to which glass-based articles are chemically strengthened, such as by ion exchange, increases in pursuit of ever greater fracture resistance the risk that the glass-based article will exhibit undesirable fracture conditions that produce a high number of fragments, sometimes referred to as frangibility, has increased. Previously, criteria for avoiding frangibility in strengthened glasses have been based on limiting the maximum central tension (CT), the stored strain energy (SSE) or the tensile-stress factor ($K_T$) of the strengthened glass-based article. However, these limits are not universally applicable. Described herein are new criteria for determining the frangibility of a glass-based article, particularly those with higher fracture toughness and/or depths of compression relative to thickness than previous glass-based articles. These criteria are based on relationships between properties of the glass-based substrate utilized to form the glass-based article, such as the fracture toughness and Young's modulus, and properties of the stress profile, such as the depth of compression and the tensile-stress factor.

Additionally, these criteria may be applied without destruction of the glass-based article in some embodiments, allowing use in quality control applications.

Figure 1:
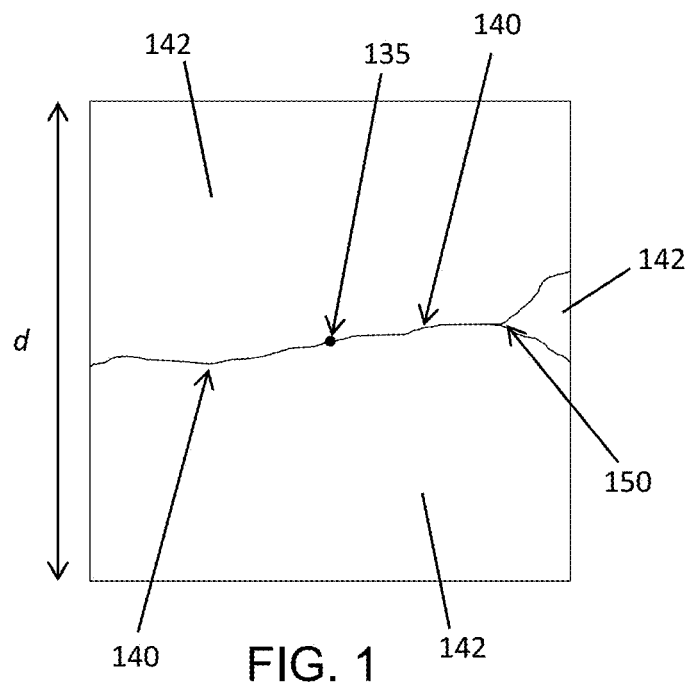
FIG. 1 is representation of a non-frangible sample after a frangibility test.

As utilized herein, a glass-based article is considered "non-frangible" when it exhibits at least one of the following in a test area as the result of a frangibility test: (1) four or less fragments with a largest dimension of at least 1 mm, and/or (2) the number of bifurcations is less than or equal to 1.5 bifurcations per crack branch. The fragments, bifurcations, and crack branches are counted based on any 5 cm by 5 cm square centered on the impact point. Thus, a glass is considered non-frangible if it meets one or both of tests (1) and (2) for any 5 cm by 5 cm square centered on the impact point where the breakage is created according to the procedure described below. In a frangibility test, an impact probe is brought in to contact with the glass, with the depth to which the impact probe extends into the glass increasing in successive contact iterations. The step-wise increase in depth of the impact probe allows the flaw produced by the impact probe to reach the tension region while preventing the application of excessive external force that would prevent the accurate determination of the frangible behavior of the glass. The glass-based article is placed on a steel surface such as a MVN precision vertical stage available from Newport Corporation. The impact probe is a stylus with a tungsten carbide tip (available from Fisher Scientific Industries, under the trademark TOSCO® and manufacturer identifying number #13-378, with a 60 degree coni-spherical tip), having a weight of 40 g, and is connected to a clamp on a gear driven mechanism that moves the stylus up and down. In one embodiment, the depth of the impact probe in the glass may increase by about 5 μm in each iteration, with the impact probe being removed from contact with the glass between each iteration. The test area is any 5 cm by 5 cm square centered at the impact point. FIG. 1 depicts a non-frangible test result. As shown in FIG. 1, the test area is a square that is centered at the impact point 135, where the length of a side of the square d is 5 cm. The non-frangible sample shown in FIG. 1 includes three fragments 142, and two crack branches 140 and a single bifurcation 150. Thus, the non-frangible sample shown in FIG. 1 contains less than 4 fragments having a largest dimension of at least 1 mm and the number of bifurcations is less than or equal to the number of crack branches (0.5 bifurcations per crack branch). As utilized herein, a crack branch originates at the impact point, and a fragment is considered to be within the test area if any part of the fragment extends into the test area. While coatings, adhesive layers, and the like may be used in conjunction with the strengthened glass-based articles described herein, such external restraints are not used in determining the frangibility or frangible behavior of the glass-based articles. In some embodiments, a film that does not impact the fracture behavior of the glass-based article may be applied to the glass-based article prior to the frangibility test to prevent the ejection of fragments from the glass-based article, increasing safety for the person performing the test.

Figure 2:
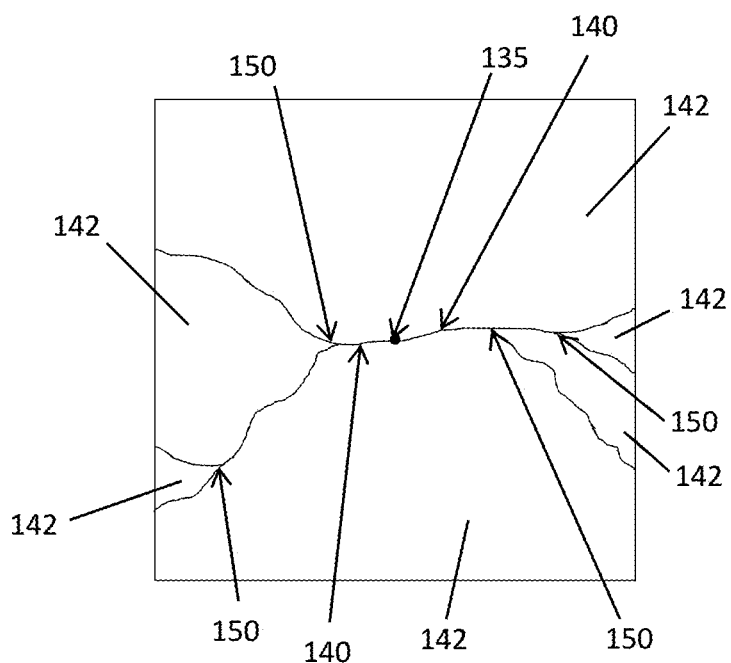
FIG. 2 is a representation of a frangible sample after a frangibility test.

A frangible sample is depicted in FIG. 2. The frangible sample includes 6 fragments 142 having a largest dimension of at least 1 mm. The sample depicted in FIG. 2 includes 2 crack branches 140 and 4 bifurcations 150, producing more bifurcations than crack branches (2 bifurcations per crack branch). Thus, the sample depicted in FIG. 2 does not exhibit four or less fragments or less than or equal to 1.5 bifurcations per crack branch. While FIGS. 1 and 2 include two crack branches 140 originating at the impact point 135, it is understood that more than two crack branches may originate at the impact point, such as three or more crack branches.

In the frangibility test described herein, the impact is delivered to the surface of the glass article with a force that is just sufficient to release the internally stored energy present within the strengthened glass article. That is, the point impact force is sufficient to create at least one new crack at the surface of the strengthened glass sheet and extend the crack through the compressive stress CS region (i.e., past the depth of compression) into the central tension region.

Accordingly, the glass-based articles described herein are "non-frangible" i.e., they do not exhibit frangible behavior as described hereinabove when subjected to impact by a sharp object.

Previously, the most widely applicable empirical frangibility limit for chemically strengthened glass-based articles was based on stored tensile-strain energy in the tension region of the strengthened glass-based article. As utilized herein, the term tensile-strain energy (TSE) represents the energy stored in the tension zone of a unit area of a glass-based article sheet (1 square meter). The TSE limit has been observed to be about 18 J/m², where each of the two mutually orthogonal dimensions x and y parallel to the surface of the glass-based article is allowed a budget of about 9 J/m². The TSE per dimension (x and y) is given by:

$$TSE_x = \frac{1-v}{2E} \int_{DOC_1}^{DOC_2} \sigma_x^2(z)dz$$

$$TSE_y = \frac{1-v}{2E} \int_{DOC_1}^{DOC_2} \sigma_y^2(z)dz$$

where E is the Young's modulus, v is the Poisson's ratio, $DOC_1$ is the first depth of compression, $DOC_2$ is the second depth of compression, z is the position in the thickness direction, and $\sigma_x$ and $\sigma_y$ are the components of the stress tensor in the plane parallel to the glass-based article surface, in the direction of the corresponding x and y axes that define the 2-dimensional space of the glass-based article. In the interior of the area of a glass-based article sheet these two components of the in-plane stress are approximately equal, so they each carry about the same strain energy, and the frangibility limit for the total tensile-strain energy of 18 J/m² can be replaced by a limit of 9 J/m² for a single component of the in-plane stress, e.g., $\sigma_x$.

In a related approach, a frangibility limit has previously been defined in terms of a quantity labeled $K_T$, having the units of stress-intensity factor, e.g., MPa√m. As utilized herein, the quantity $K_T$ is the tensile-stress factor given by the equation:

$$K_T = \sqrt{\int_{DOC_1}^{DOC_2} \sigma^2(z)dz}$$

where σ is represented by one of the in-plane components (as the in-plane components are presumed to be equal), and z is the position in the thickness direction. To obtain the values of $K_T$ in units of MPa√m, the stress values under the integral should be in MPa, while the thickness position scale z should be in m.

U.S. Pat. No. 9,604,876 B2 discloses in Table 2 that samples with a $K_T$ of 1.4 MPa$\sqrt{m}$ and higher produce a large number of fragments when fractured, while samples with $K_T$ of 1.3 MPa$\sqrt{m}$ or less do not produce excessive fragmentation. At the same time, the maximum central tension (CT) inside the tension zone was 74 MPa and 72 MPa for the highly fragmented examples, and not exceeding 68 MPa for all other examples. It should be noted that in most cases typical of chemical strengthening, the CT is at the middle of the thickness of the glass sheet. These examples are approximately consistent with the publication by E. Bouyne and O. Gaume, "Fragmentation of thin chemically tempered glass plates", Glass Technology 2002, 43C, pp. 300-302, where a high degree of fragmentation is reported with increasing values of $K_T$, and all samples with $K_T$ of 1.4 MPa$\sqrt{m}$ or higher had produced a large number of fragments (at least 5 in a 5 cm×5 cm square area).

As utilized herein, the "frangibility limit" represents the boundary between the conditions where a glass-based article exhibits excessive fragmentation (frangible) and where the glass-based article does not exhibit excessive fragmentation (non-frangible). The condition at the frangibility limit may be expressed in terms of a critical (frangibility-limit) value of a parameter such as the tensile-strain energy TSE or the tensile-stress factor $K_T$ that has been shown to correlate with the degree of fragmentation. The total tensile-strain energy (accounting for both x and y dimensions of strain) is related to the tensile-strain factor $K_T$ measured for a single stress component (x or y) by the equation:

$$TSE = \frac{1-v}{E} K_T^2$$

When the stress components along x and y differ substantially and can be measured, the tensile-strain energy stored in each dimension can be calculated individually as follows:

$$TSE_x = \frac{1-v}{E} K_{T,x}^2$$
$$TSE_y = \frac{1-v}{E} K_{T,y}^2$$

The frangibility limit values of TSE and described herein $K_T$ depend at least in part on the material properties, such as fracture toughness, of the glass-based substrate utilized to form the glass-based article, and on the parameters of the stress profile, such as the ratio of the depth of compression to the thickness, of the glass-based article. Stated differently, the frangibility limits described herein take in to account the fracture toughness that was not considered in previous frangibility determinations.

Generally, the properties described herein that refer to a glass having a composition equivalent to the composition at the center of the glass-based article are dependent on the composition of the glass-based substrate that was ion exchanged to form the glass-based article. In practice, the composition at the center of the glass-based article may be measured by techniques known in the art, and the fracture toughness ($K_{IC}$) and Young's modulus (E) values of glass compositions produced having the measured composition may be measured. Additionally, the center of the glass-based article is not affected by or minimally affected by the ion exchange process, such that the composition at the center of the glass-based article is substantially the same or the same as the composition of the glass-based substrate. For this reason, the $K_{IC}$ and E values, among others, of a glass composition having the composition at the center of the glass-based article may be determined by measuring these properties of the glass-based substrate before the ion exchange treatment.

The properties of the glass-based articles will now be discussed. These properties can be achieved by modifying the component amounts of the glass-based composition or the stress profile of the glass-based article.

Compositions utilized to form the glass-based articles according to embodiments have a high fracture toughness ($K_{IC}$). In some embodiments, the compositions utilized to form the glass-based articles exhibit a $K_{IC}$ value greater than or equal to 0.67 MPa$\sqrt{m}$, such as greater than or equal to 0.68 MPa$\sqrt{m}$, greater than or equal to 0.69 MPa$\sqrt{m}$, greater than or equal to 0.70 MPa$\sqrt{m}$, greater than or equal to 0.71 MPa$\sqrt{m}$, greater than or equal to 0.72 MPa$\sqrt{m}$, greater than or equal to 0.73 MPa$\sqrt{m}$, greater than or equal to 0.74 MPa$\sqrt{m}$, greater than or equal to 0.75 MPa$\sqrt{m}$, greater than or equal to 0.76 MPa$\sqrt{m}$, greater than or equal to 0.77 MPa$\sqrt{m}$, greater than or equal to 0.78 MPa$\sqrt{m}$, greater than or equal to 0.79 MPa m$^{0.5}$, greater than or equal to 0.80 MPa m$^{0.5}$, greater than or equal to 0.81 MPa$\sqrt{m}$, greater than or equal to 0.82 MPa$\sqrt{m}$, greater than or equal to 0.83 MPa$\sqrt{m}$, greater than or equal to 0.84 MPa$\sqrt{m}$, greater than or equal to 0.86 MPa$\sqrt{m}$, greater than or equal to 0.87 MPa$\sqrt{m}$, greater than or equal to 0.88 MPa$\sqrt{m}$, greater than or equal to 0.89 MPa$\sqrt{m}$, greater than or equal to 0.90 MPa$\sqrt{m}$, greater than or equal to 0.91 MPa$\sqrt{m}$, greater than or equal to 0.92 MPa$\sqrt{m}$, greater than or equal to 0.93 MPa$\sqrt{m}$, greater than or equal to 0.94 MPa$\sqrt{m}$, greater than or equal to 0.95 MPa$\sqrt{m}$, greater than or equal to 0.96 MPa$\sqrt{m}$, greater than or equal to 0.97 MPa$\sqrt{m}$, greater than or equal to 0.98 MPa$\sqrt{m}$, greater than or equal to 0.99 MPa$\sqrt{m}$, greater than or equal to 1.00 MPa$\sqrt{m}$, greater than or equal to 1.01 MPa$\sqrt{m}$, greater than or equal to 1.02 MPa$\sqrt{m}$, greater than or equal to 1.03 MPa$\sqrt{m}$, greater than or equal to 1.04 MPa$\sqrt{m}$, greater than or equal to 1.05 MPa$\sqrt{m}$, greater than or equal to 1.06 MPa$\sqrt{m}$, greater than or equal to 1.07 MPa$\sqrt{m}$, greater than or equal to 1.08 MPa$\sqrt{m}$, greater than or equal to 1.09 MPa$\sqrt{m}$, greater than or equal to 1.10 MPa$\sqrt{m}$, greater than or equal to 1.11 MPa$\sqrt{m}$, greater than or equal to 1.12 MPa$\sqrt{m}$, greater than or equal to 1.13 MPa$\sqrt{m}$, greater than or equal to 1.14 MPa$\sqrt{m}$, greater than or equal to 1.15 MPa$\sqrt{m}$, greater than or equal to 1.16 MPa$\sqrt{m}$, greater than or equal to 1.17 MPa$\sqrt{m}$, greater than or equal to 1.18 MPa$\sqrt{m}$, greater than or equal to 1.19 MPa$\sqrt{m}$, greater than or equal to 1.20 MPa$\sqrt{m}$, greater than or equal to 1.21 MPa$\sqrt{m}$, greater than or equal to 1.22 MPa$\sqrt{m}$, greater than or equal to 1.23 MPa$\sqrt{m}$, greater than or equal to 1.24 MPa$\sqrt{m}$, greater than or equal to 1.25 MPa$\sqrt{m}$, greater than or equal to 1.26 MPa$\sqrt{m}$, greater than or equal to 1.27 MPa$\sqrt{m}$, greater than or equal to 1.28 MPa$\sqrt{m}$, greater than or equal to 1.29 MPa$\sqrt{m}$, greater than or equal to 1.30 MPa$\sqrt{m}$, greater than or equal to 1.31 MPa$\sqrt{m}$, greater than or equal to 1.32 MPa$\sqrt{m}$, greater than or equal to 1.33 MPa$\sqrt{m}$, or greater than or equal to 1.34 MPa$\sqrt{m}$. In embodiments, the compositions utilized to form the glass-based articles exhibit a $K_{IC}$ value greater than or equal to 0.67 MPa$\sqrt{m}$ to less than or equal to 1.34 MPa$\sqrt{m}$, such as from greater than or equal to 0.68 MPa$\sqrt{m}$ to less than or equal to 1.33 MPa$\sqrt{m}$, from greater than or equal to 0.70 MPa$\sqrt{m}$ to less than or equal to 1.32 MPa$\sqrt{m}$, from greater than or equal to 0.72 MPa$\sqrt{m}$ to less than or equal to 1.31 MPa$\sqrt{m}$, from greater than or equal to 0.74

MPa√m to less than or equal to 1.30 MPa√m, from greater than or equal to 0.76 MPa√m to less than or equal to 1.29 MPa√m, from greater than or equal to 0.78 MPa√m to less than or equal to 1.28 MPa√m, from greater than or equal to 0.80 MPa√m to less than or equal to 1.27 MPa√m, from greater than or equal to 0.82 MPa√m to less than or equal to 1.26 MPa√m, from greater than or equal to 0.84 MPa√m to less than or equal to 1.25 MPa√m, from greater than or equal to 0.85 MPa√m to less than or equal to 1.24 MPa√m, from greater than or equal to 0.86 MPa√m to less than or equal to 1.23 MPa√m, from greater than or equal to 0.87 MPa√m to less than or equal to 1.22 MPa√m, from greater than or equal to 0.88 MPa√m to less than or equal to 1.21 MPa√m, from greater than or equal to 0.89 MPa√m to less than or equal to 1.20 MPa√m, from greater than or equal to 0.90 MPa√m to less than or equal to 1.19 MPa√m, from greater than or equal to 0.91 MPa√m to less than or equal to 1.18 MPa√m, from greater than or equal to 0.92 MPa√m to less than or equal to 1.17 MPa√m, from greater than or equal to 0.93 MPa√m to less than or equal to 1.16 MPa√m, from greater than or equal to 0.94 MPa√m to less than or equal to 1.15 MPa√m, from greater than or equal to 0.95 MPa√m to less than or equal to 1.14 MPa√m, from greater than or equal to 0.96 MPa√m to less than or equal to 1.13 MPa√m, from greater than or equal to 0.97 MPa√m to less than or equal to 1.12 MPa√m, from greater than or equal to 0.98 MPa√m to less than or equal to 1.11 MPa√m, from greater than or equal to 0.99 MPa√m to less than or equal to 1.10 MPa√m, from greater than or equal to 1.00 MPa√m to less than or equal to 1.09 MPa√m, from greater than or equal to 1.01 MPa√m to less than or equal to 1.08 MPa√m, from greater than or equal to 1.02 MPa√m to less than or equal to 1.07 MPa√m, from greater than or equal to 1.03 MPa√m to less than or equal to 1.06 MPa√m, from greater than or equal to 1.04 MPa√m to less than or equal to 1.05 MPa√m, and all ranges and sub-ranges between the foregoing values. In some embodiments, the compositions utilized to form the glass-based articles exhibit a $K_{IC}$ value greater than or equal to 0.90 MPa√m. In some embodiments, the compositions utilized to form the glass-based articles exhibit a $K_{IC}$ value less than or equal to 1.5 MPa√m.

Figure 3:
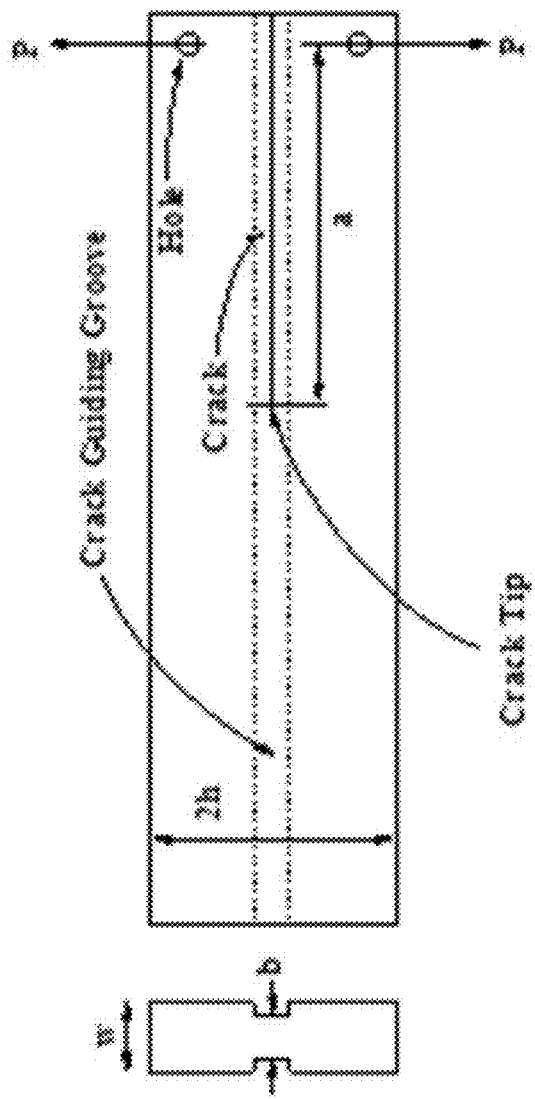
FIG. 3 is a schematic representation of a sample utilized to determine the fracture toughness $K_{IC}$ and a cross-section thereof.

As utilized herein, the $K_{IC}$ fracture toughness is measured by the double cantilever beam (DCB) method. The $K_{IC}$ values were measured on glass-based substrates before being ion exchanged to form the glass-based articles. The DCB specimen geometry is shown in FIG. 3 with important parameters being the crack length a, applied load P, cross-sectional dimensions w and 2h, and the thickness of the crack-guiding groove b. The samples were cut into rectangles of width 2h=1.25 cm and a thickness ranging from, w=0.3 mm to 1 mm, with the overall length of the sample, which is not a critical dimension, varying from 5 cm to 10 cm. A hole was drilled on both ends with a diamond drill to provide a means of attaching the sample to a sample holder and to the load. A crack "guiding groove" was cut down the length of the sample on both flat faces using a wafer dicing saw with a diamond blade, leaving a "web" of material, approximately half the total plate thickness (dimension b in FIG. 3), with a height of 180 µm corresponding to the blade thickness. The high precision dimensional tolerances of the dicing saw allow for minimal sample-to-sample variation. The dicing saw was also used to cut an initial crack where a=15 mm. As a consequence of this final operation a very thin wedge of material was created near the crack tip (due to the blade curvature) allowing for easier crack initiation in the sample. The samples were mounted in a metal sample holder with a steel wire in the bottom hole of the sample. The samples were also supported on the opposite end to keep the samples level under low loading conditions. A spring in series with a load cell (FUTEK, LSB200) was hooked to the upper hole which was then extended, to gradually apply load, using rope and a high precision slide. The crack was monitored using a microscope having a 5 µm resolution attached to a digital camera and a computer. The applied stress intensity, $K_P$, was calculated using the following equation:

$$K_P = \left[\frac{P \cdot a}{(w \cdot b)^{0.5} h^{1.5}}\right]\left[3.47 + 2.32\frac{h}{a}\right]$$

For each sample, a crack was first initiated at the tip of the web, and then the starter crack was carefully sub-critically grown until the ratio of dimensions a/h was greater than 1.5, which is required for the above equation to accurately calculate stress intensity. At this point the crack length, a, was measured and recorded using a traveling microscope with 5 µm resolution. A drop of toluene was then placed into the crack groove and wicked along the entire length of groove by capillary forces, pinning the crack from moving until the fracture toughness is reached. The load was then increased until sample fracture occurred, and the critical stress intensity $K_{IC}$ calculated from the failure load and sample dimensions, with $K_P$ being equivalent to $K_{IC}$ due to the measurement method.

The Young's modulus (E) of the glass compositions utilized to form the glass-based articles has a negative correlation with the drop performance of the glass-based articles. In embodiments, the compositions utilized to form the glass-based articles exhibit a Young's modulus (E) from greater than or equal to 60 GPa to less than or equal to 120 GPa, such as from greater than or equal to 62 GPa to less than or equal to 115 GPa, from greater than or equal to 64 GPa to less than or equal to 113 GPa, from greater than or equal to 66 GPa to less than or equal to 112 GPa, from greater than or equal to 68 GPa to less than or equal to 111 GPa, from greater than or equal to 70 GPa to less than or equal to 110 GPa, from greater than or equal to 72 GPa to less than or equal to 109 GPa, from greater than or equal to 74 GPa to less than or equal to 108 GPa, from greater than or equal to 76 GPa to less than or equal to 107 GPa, from greater than or equal to 78 GPa to less than or equal to 106 GPa, from greater than or equal to 80 GPa to less than or equal to 105 GPa, from greater than or equal to 82 GPa to less than or equal to 104 GPa, from greater than or equal to 84 GPa to less than or equal to 103 GPa, from greater than or equal to 86 GPa to less than or equal to 102 GPa, from greater than or equal to 88 GPa to less than or equal to 101 GPa, from greater than or equal to 90 GPa to less than or equal to 100 GPa, from greater than or equal to 91 GPa to less than or equal to 99 GPa, from greater than or equal to 92 GPa to less than or equal to 98 GPa, from greater than or equal to 93 GPa to less than or equal to 97 GPa, from greater than or equal to 94 GPa to less than or equal to 96 GPa, or equal to 95 GPa, and all ranges and sub-ranges between the foregoing values. In embodiments, the compositions utilized to form the glass-based articles exhibit a Young's modulus (E) from greater than or equal to 80 GPa to less than or equal to 120 GPa. In some embodiments, the compositions utilized to form the glass-based articles may have a Young's modulus (E) greater than or equal to 120 MPa. The Young's modulus values recited in this disclosure refer to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

The glass-based articles may have any suitable thickness. In embodiments, the glass-based articles may have a thickness (t) from greater than or equal to 0.2 mm to less than or equal to 2.0 mm, such as from greater than or equal to 0.3 mm to less than or equal to 1.0 mm, from greater than or equal to 0.4 mm to less than or equal to 0.9 mm, from greater than or equal to 0.5 mm to less than or equal to 0.8 mm, from greater than or equal to 0.6 mm to less than or equal to 0.7 mm, and all ranges and sub-ranges between the foregoing values.

The Poisson's ratio values recited in this disclosure refer to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

Figure 4:
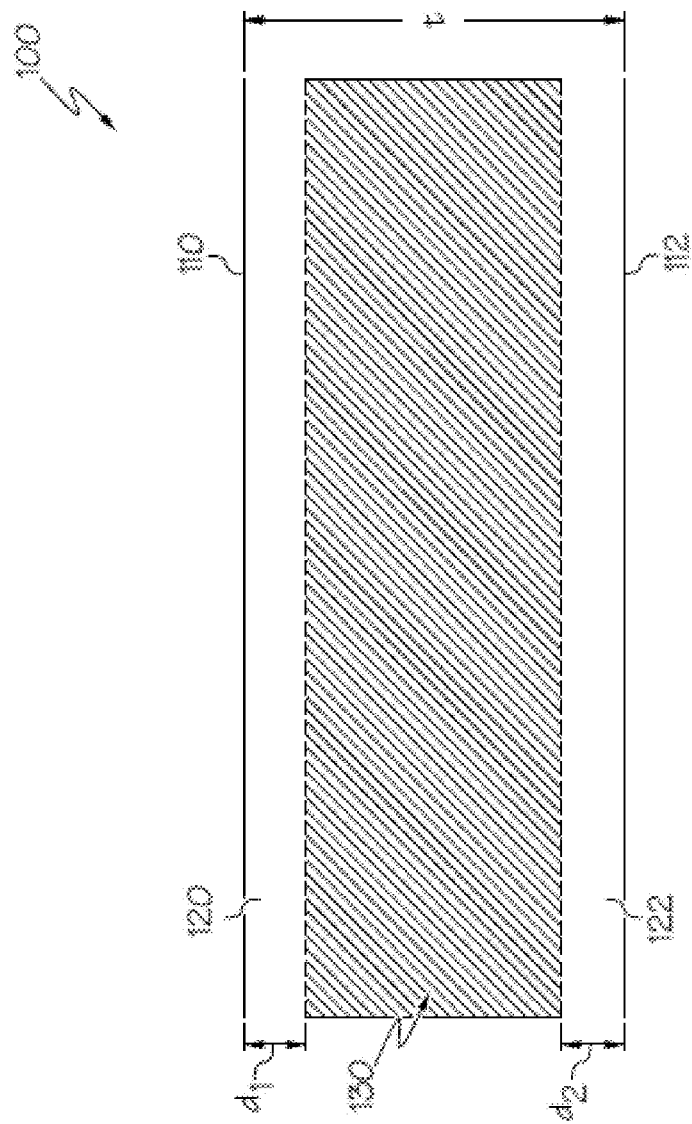
FIG. 4 schematically depicts a cross section of a glass-based article having compressive stress layers on surfaces thereof according to embodiments disclosed and described herein.

As mentioned above, the glass-based articles are strengthened, such as by ion exchange, making a glass that is damage resistant for applications such as, but not limited to, articles for display covers or electronic device housings. With reference to FIG. 4, the glass-based article has a first region under compressive stress (e.g., first and second compressive layers 120, 122 in FIG. 4) extending from the surface to a depth of compression (DOC) of the glass-based article and a second region (e.g., central region 130 in FIG. 4) under a tensile stress or central tension (CT) extending from the DOC into the central or interior region of the glass-based article. As used herein, DOC refers to the depth at which the stress within the glass-based article changes from compressive to tensile. At the DOC, the stress crosses from a positive (compressive) stress to a negative (tensile) stress and thus exhibits a stress value of zero.

According to the convention normally used in the art, compression or compressive stress is expressed as a negative (<0) stress and tension or tensile stress is expressed as a positive (>0) stress. Throughout this description, however, CS is expressed as a positive or absolute value—i.e., as recited herein, CS=|CS|. The compressive stress (CS) has a maximum at or near the surface of the glass-based article, and the CS varies with distance d from the surface according to a function. Referring again to FIG. 4, a first segment 120 extends from first surface 110 to a depth $d_1$ and a second segment 122 extends from second surface 112 to a depth $d_2$. Together, these segments define a compression or CS of glass-based article 100. The compressive stress of both major surfaces (110, 112 in FIG. 4) is balanced by stored tension in the central region (130) of the glass. In some embodiments, $d_1=d_2$ as measured from the first surface 110 and the second surface 112, respectively. For the sake of convenience, where a single DOC is referred to herein, the stress profile is presumed to be symmetrical such that $DOC_1=DOC_2$ as measured from the first surface 110 and the second surface 112, respectively.

The stress profiles of the glass-based articles were measured differently based on the composition of the glass-based substrate utilized to form the glass-based article. The method utilized for sodium aluminosilicate glasses was different than for lithium aluminosilicate glasses.

The stress profiles of glass-based articles formed from sodium aluminosilicate (SAS) glass-based substrates strengthened via ion exchange of potassium for sodium was measured from the refractive index profiles for TM and TE waves obtained by using inverse-WKB profile extraction applied to the measured effective indices of guided modes for the TM and TE waves using a prism-coupling technique, at either 633 nm or 595 nm. The stress profile was extracted to the extent of the K-penetration by subtracting the two index profiles and dividing by the stress-optic coefficient. Then an assumption was made that in the tension zone the profile starts with a parabolic shape from the DOC to a depth $d_c$ at which the profile flattens, after which a constant tension equal to the profile CT extends through the mid-thickness and to the same depth $d_c$ on the other side. The depth $d_c$ was chosen based on empirical observations to equal to $1.15 \cdot DOL_K$ for composition 2 which has no K in the base glass, and $1.4 \cdot DOL_K$ for compositions 1 and 4 which have a substantial amount of K in the base glass prior to ion exchange, where $DOL_K$ refers to "depth of layer—potassium" or the depth of potassium penetration as a result of an ion exchange process as determined for single-step ion exchanged profiles by the prism-coupling stress meter FSM-6000, manufactured by Orihara Industrial Co., Ltd. (Japan). With this assumption, the through-thickness integral of tension in the tension zone becomes a simple function of the CT when the thickness t, the DOC, and the depth $d_c$ are known, and after equating this integral to the integral of measured compressive stress on either side of the tension zone (to ensure force balance), the center tension CT is found. Knowing the value of CT, the values of $K_T$ and TSE are obtained from the assumed shape of the tension zone.

The stress profiles of glass-based articles formed from lithium aluminosilicate (LAS) glass-based substrates where the stress profile has a deep component produced by Na exchanging for Li, and may have a shallow component obtained by K exchanging for Li or for Na and Li, the values of TSE and $K_T$ have been obtained by combining a measurement of CT using a properly calibrated scattered-light polarimeter (SCALP) made by GlassStress with a measurement of DOC using a different scattered-light polarimeter (SLP-1000) made by Orihara instruments. When a K-enriched high-compression layer is present on the surface, a measurement of surface compressive stress CS, spike depth of layer $DOL_{sp}$, and knee stress $CS_K$ at $DOL_{sp}$ using prism-coupling stress measurements was also utilized.

The prism-coupling measurements utilized the refracted near-field (RNF) method. The maximum CT value provided by SCALP is utilized in the RNF method. In particular, the stress profile measured by RNF is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass article adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal.

To force balance the stress profile measured by RNF the stress profile is shifted vertically until the total stress-depth area in the compression regions equals the area in the tension region. When the stress profile is symmetric, equate the area of the compression region closest to the reference block to the area of the half of the tension region that is also closest to the reference block may be equated for better accuracy. After force balancing, the CT of the force balanced RNF profile is divided by the SCALP CT to find a calibration (scaling) factor. The force balanced profile is then divided by the calibration factor to produce a force balanced and calibrated stress profile.

The contribution of the surface spike of K to the CT is calculated by:

$$CT_{sp} = \frac{(CS - CS_K)DOL_{sp}}{t - DOL_K}$$

where t is thickness of the glass-based article. The spike refers to the steep portion of the stress profile near the surface that is potassium enriched and exhibits high compression. In embodiments, the $DOL_{sp}$ may be equivalent to the $DOL_K$ for glass-based articles formed from lithium containing glass-based substrates and ion exchanged with a potassium containing salt bath. The contribution of the deep component of the stress profile produced by the Na-for-Li ion exchange is calculated by:

$$CT_{deep} = CT - CT_{sp}$$

The Na diffusion depth for the examples of interest using LAS glasses was comparable to the half of the glass-sheet thickness, and the shape of the stress profile in the tension zone could be adequately approximated as the absolute value of a power-law shape with power coefficient p falling in the range 1.5-3 (where p=2 would correspond to parabolic shape). With that assumption, the exact solution for the ratio DOC/t given p, $CT_{deep}$, and the total CT measured by SCALP is:

$$\frac{DOC}{t} = 0.5\left\{1 - \left[\frac{CT}{(1+p)CT_{deep}}\right]^{\frac{1}{p}}\right\}$$

After measuring CT and DOC as described above, measuring the thickness with a micrometer, and calculated $CT_{deep}$ the power coefficient p was varied until the measured DOC/t value agreed with the ratio calculated based on the above formula. This fixed p value, along with the CT and the DOC, allows the tension region to be fully determined.

By assigning a value z0 to the distance from the mid-thickness of the glass-based article to the point where the point where compression becomes tension such that:

$$z_0 = 0.5t - DOC$$

The tensile-stress factor ($K_T$) and the TSE are then calculated as a function of the power coefficient p by:

$$K_T(p) = 2pCT\sqrt{\frac{z_0}{2p^2 + 3p + 1}}$$

$$TSE(p) = \frac{1-v}{E}\frac{4p^2}{2p^2 + 3p + 1}z_0 CT^2$$

To reduce the error caused by laser-speckle and other noise sources, the CT and DOC values for each sample were averaged over at least 20 measurements, each obtained from a separate scan obtained with a slightly shifted sample position on the instrument. The identification of the location of sample surface for SLP-1000 was calibrated by measuring samples of SAS-glass for which DOC had been accurately determined by the IWKB-based stress-profile extraction method.

Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

Figure 5:
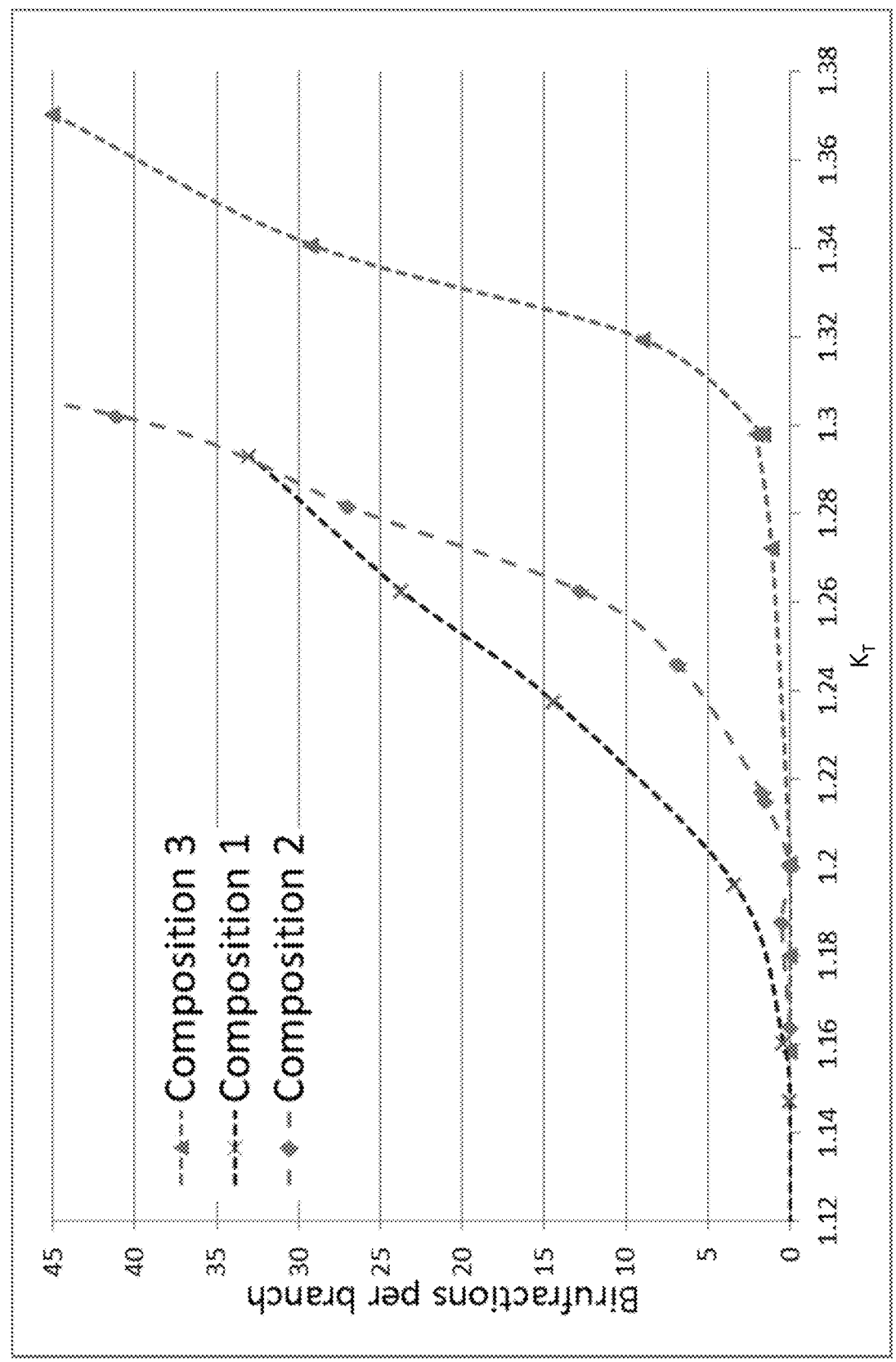
FIG. 5 is a plot of the bifurcations per crack branch as a function of tensile stress factor $K_T$ for various compositions.

In some embodiments, the frangibility limit for glass-based articled in terms of the tensile-stress factor $K_T$ and the tensile-strain energy TSE is not a constant, but depends on the fracture toughness $K_{IC}$ of the glass. FIG. 5 shows the average number of bifurcations per crack branch as a function of the tensile-stress factor $K_T$ for 3 different SAS glass compositions having different fracture toughness. The number of crack branches was usually 2 or 3, each originating at a fracture-origin location in the center of a 5 cm×5 cm square glass-based article. For the experiments in FIG. 5, the glass-based articles were 0.8 mm thick. The compositions in FIG. 5 are detailed in Table 1 below. The frangibility limit for practical purposes is defined as the critical value of $K_T$ or TSE above which the glass-based article is frangible. For the compositions presented in FIG. 5, the critical value of 1.5 bifurcations per branch occurred at a $K_T$ value of 1.18, 1.215, and 1.29, for Compositions 1, 2, and 3, respectively.

TABLE 1

| Composition | 1 | 2 | 3 | 4 | 5 | 6 | 7 | 8 | 9 |
|---|---|---|---|---|---|---|---|---|---|
| $SiO_2$ | 58.54 | 57.43 | 66.37 | 63.60 | 70.94 | 63.31 | 58.35 | 70.72 | 63.70 |
| $B_2O_3$ | | | 0.60 | | 1.86 | 6.74 | 6.07 | | 0.39 |
| $Al_2O_3$ | 15.30 | 16.10 | 10.29 | 15.67 | 12.83 | 15.20 | 17.81 | 4.28 | 16.18 |
| $Na_2O$ | 16.51 | 17.05 | 13.80 | 10.81 | 2.36 | 4.30 | 1.73 | | 8.10 |
| $K_2O$ | 2.28 | | 2.400 | | | | 0.20 | | 0.53 |
| $Li_2O$ | | | | 6.24 | 8.22 | 6.82 | 10.74 | 22.09 | 8.04 |
| MgO | 1.07 | 2.81 | 5.74 | | 2.87 | 1.00 | 4.43 | | 0.33 |
| ZnO | | | | 1.16 | 0.83 | | | | |
| $TiO_2$ | 0.004 | 0.003 | 0.003 | | | | | | 0.010 |
| CaO | | | 0.59 | | | 1.55 | 0.57 | | |
| $Fe_2O_3$ | | | | | 0.022 | | <0.02 | | 0.020 |
| $ZrO_2$ | | | | | | | | 1.97 | |
| $SnO_2$ | 0.10 | 0.07 | 0.21 | 0.04 | 0.06 | 0.05 | 0.08 | 0.08 | 0.05 |
| SrO | | | | | | 1.02 | | | |

TABLE 1-continued

| Composition | 1 | 2 | 3 | 4 | 5 | 6 | 7 | 8 | 9 |
|---|---|---|---|---|---|---|---|---|---|
| $P_2O_5$ | 6.54 | 6.54 | | 2.48 | | | | 0.85 | 2.64 |
| $K_{IC}$ (MPa√m) | 0.660 | 0.676 | 0.732 | 0.751 | 0.841 | 0.871 | 0.948 | 1.335 | 0.795 |
| Poisson Ratio | 0.205 | 0.215 | 0.211 | 0.210 | 0.200 | 0.230 | 0.236 | 0.190 | 0.210 |
| Young's Modulus (GPa) | 63.9 | 66.0 | 72.9 | 76.3 | 80.0 | 76.7 | 83.0 | 101.0 | 77.3 |

Composition 8 is a transparent glass ceramic. This composition was formed by ceramming a precursor glass.

As shown in Tables 2 and 3 below, the examples in FIG. 5 were produced using a single step ion exchange, with a bath primarily composed of $KNO_3$ and a small amount of $NaNO_3$. The time period of the ion exchange was varied in the range described in Table 2 to produce samples with different tensile stress factors and DOC/t. The resulting compressive stress was about 800 MPa for composition 2, and between 750 MPa and 800 MPa for compositions 1 and 3. The DOC was in the range of 43 to 60 μm. The steep region of the curves shown in FIG. 5 began at a DOC above about 53 μm for compositions 1 and 3, and about 47 μm for composition 2. The ratio DOC/t at the onset of the steep region of the curves in FIG. 5 fell between 0.058 and 0.070 for all of the compositions.

TABLE 2

| | | Step 1 | | | | | Step 2 | | | |
|---|---|---|---|---|---|---|---|---|---|---|
| IOX Condition | Thickness (mm) | $NaNO_3$ (wt %) | $KNO_3$ (wt %) | $LiNO_3$ (wt %) | Temperature (° C.) | Time (hours) | $NaNO_3$ (wt %) | $KNO_3$ (wt %) | Temperature (° C.) | Time (hours) |
| 1 | 0.8 | ≤1 | 99 | 0 | 390 | 2 to 4 | | | | |
| 2 | 0.8 | 1.5 | 98.5 | 0 | 420 | 2.7 to 3.7 | | | | |
| 3 | 0.8 | ≤1 | 99 | 0 | 390 | 6.5 to 24 | | | | |
| 4 | 0.8 | 85 | 15 | 0 | 380 | 3.75 | 9 | 91 | 380 | 0.6 |
| 5 | 0.9 | 85 | 15 | 0 | 380 | 4.5 | 9 | 91 | 380 | 0.6 |
| 6 | 1 | 85 | 15 | 0 | 380 | 5.5 | 9 | 91 | 380 | 0.6 |
| 7 | 0.8 | 9.5 | 91.5 | 0 | 430 | 4.25 | | | | |
| 8 | 0.8 | 100 | 0 | 0 | 430 | 7 | | | | |
| 9 | 0.9 | 100 | 0 | 0 | 400 | 16 | | | | |
| 10 | 0.8 | 7 | 93 | 0 | 430 | 12 | | | | |
| 11 | 0.8 | 7 | 93 | 0 | 430 | 12 | | | | |
| 12 | 0.8 | 70 | 30 | 0.4 | 470 | 12 | 70 | 30 | 470 | 1.5 |
| 13 | 0.8 | 100 | 0 | 0 | 470 | 15 | | | | |
| 14 | 0.8 | 75 | 25 | 0.6 | 390 | 3.75 | | | | |

IOX conditions 10 and 11 utilized the same salt concentration and same ion exchange time. However, condition 10 employed dense packing (≥0.01 m² of glass per kg of salt) of the glass samples while condition 11 employed less dense packing (<0.005 m² of glass per kg of salt).

TABLE 3

| Composition | IOX Condition | $K_T$ (MPa√m) | $K_T^2$ (MPa²m) | TSE (J/m²) | Frangible | $DOL_{spike}$ (μm) | $CS_{max} - CS_K$ (MPa) | DOC (μm) |
|---|---|---|---|---|---|---|---|---|
| 1 | 1 | 1.18 | 1.392 | 17.3 | L | | | |
| 2 | 2 | 1.215 | 1.476 | 17.6 | L | | | |
| 3 | 3 | 1.29 | 1.664 | 18 | L | | | |
| 4 | 4 | 1.164 | 1.354 | 14 | N | 9 | 700 | 155 |
| 4 | 5 | 1.255 | 1.574 | 16.3 | N | 10 | 700 | 172 |
| 4 | 6 | 1.387 | 1.925 | 19.9 | L/Y | 10 | 700 | 187 |
| 5 | 7 | 1.486 | 2.207 | 22.1 | L/Y | 8 | 540 | 166 |
| 6 | 8 | 1.57 | 2.465 | 24.8 | N | 5 | 1 | 171 |
| 6 | 9 | 1.757 | 3.085 | 31 | Y | 5 | 10 | 190 |
| 7 | 10 | 1.413 | 1.997 | 18.4 | N | 9 | 570 | 180 |
| 7 | 11 | 1.569 | 2.461 | 22.7 | Y | 9 | 570 | 180 |
| 8 | 12 | 2.152 | 4.632 | 37.1 | N | 3 | 100 | 155 |
| 8 | 13 | 2.598 | 6.75 | 54.1 | Y | 3 | 100 | 159 |
| 9 | 14 | 1.516 | 2.298 | 23.5 | L | 11 | 200 | 150 |

TABLE 3-continued

| Composition | IOX Condition | CT (MPa) | CT$_{spike}$ (MPa) | CT$_{deep}$ (MPa) | p$_{estimated}$ | K$_T$ estimated (MPa√m) | K$_{CS}$ estimated (MPa√m) |
|---|---|---|---|---|---|---|---|
| 4 | 4 | 72 | 8 | 64 | 2 | 1.164 | |
| 4 | 5 | 72 | 7.9 | 64.1 | 2.1 | 1.255 | |
| 4 | 6 | 73 | 7.1 | 65.9 | 2.4 | 1.397 | |
| 5 | 7 | 97 | 5.5 | 91.5 | 1.8 | 1.486 | 2.34 |
| 6 | 8 | 101 | 0 | 101 | 1.95 | 1.57 | 1.966 |
| 6 | 9 | 105.5 | 0.1 | 105.4 | 2 | 1.757 | 2.22 |
| 7 | 10 | 107 | 6.5 | 100.5 | 1.25 | 1.413 | 2.194 |
| 7 | 11 | 117 | 6.5 | 110.5 | 1.3 | 1.569 | 2.34 |
| 8 | 12 | 125 | 0.4 | 124.6 | 2.6 | 2.152 | 3 |
| 8 | 13 | 155 | 0.4 | 154.6 | 2.4 | 2.598 | 3.51 |
| 9 | 14 | 86.5 | 2.8 | 83.7 | 2.7 | 1.516 | |

| Composition | IOX Condition | K$_T$/K$_{IC}$ | K$_T^2$ + (K$_{CS}^2$/28.5) (MPa$^2$m) |
|---|---|---|---|
| 5 | 7 | 1.77 | 3.54 |
| 6 | 8 | 1.87 | 3.55 |
| 6 | 9 | 2.09 | 4.45 |
| 7 | 10 | 1.68 | 2.59 |
| 7 | 11 | 1.87 | 3.16 |
| 8 | 12 | 2.56 | 3.29 |
| 8 | 13 | 3.09 | 4.73 |

Where "L" indicates the sample is at the frangibility limit, "N" indicates the sample is non-frangible, "Y" indicates the sample is frangible, and "L/Y" indicates the sample was at the limit or sometimes slightly frangible.

Figure 6:
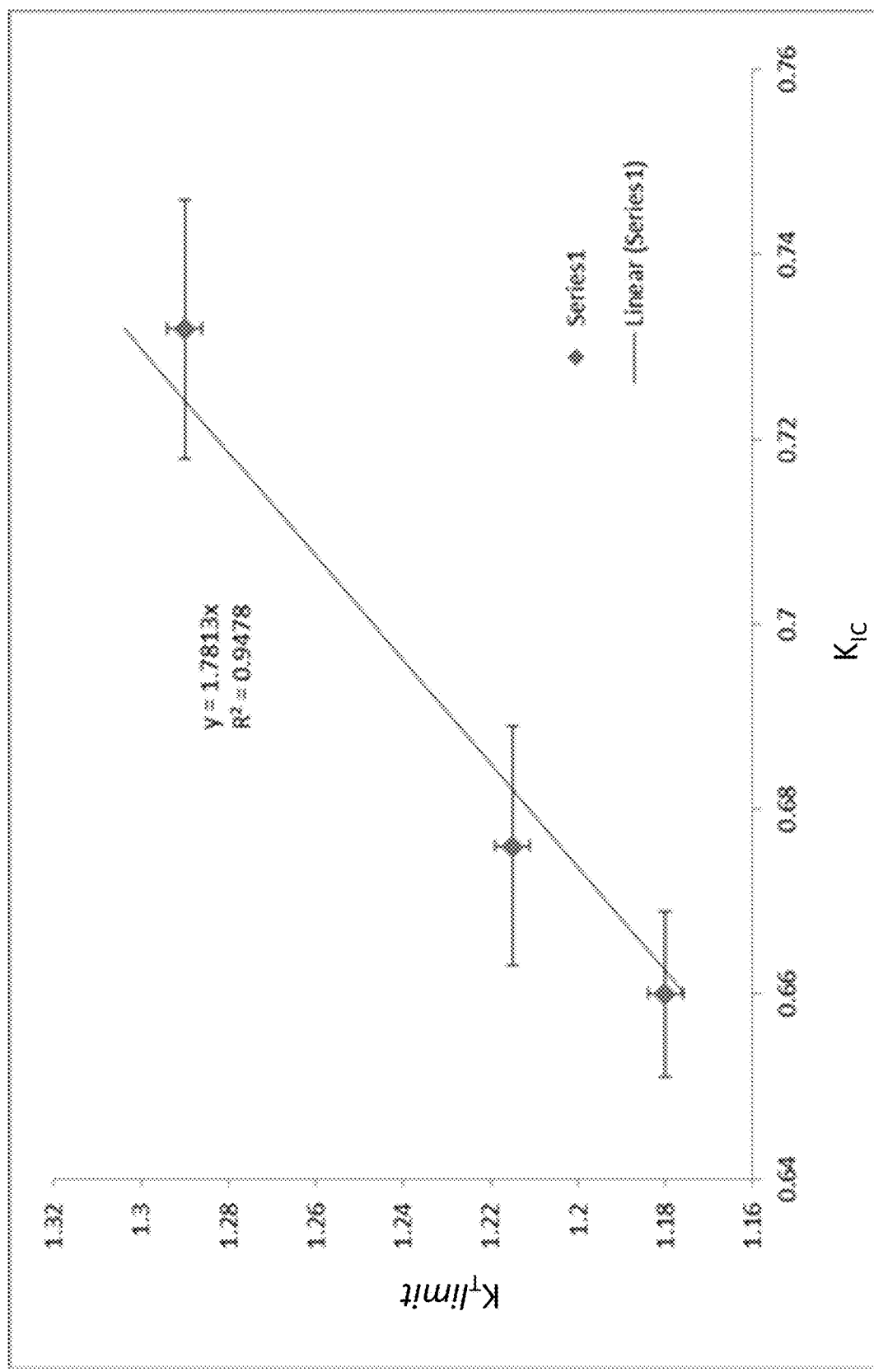
FIG. 6 is a plot of frangibility limit value of $K_T$ for the compositions of FIG. 5 as a function of fracture toughness $K_{IC}$.

The frangibility limit value of K$_T$ for compositions 1, 2, and 3 of FIG. 5 is shown as a function of the fracture toughness K$_{IC}$ is depicted in FIG. 6. A linear fit trendline through the origin provides a satisfactory fit for the experimental results in FIG. 6 when accounting for experimental standard deviations in the measurement of K$_{IC}$. This linear fit demonstrates that the frangibility limit in terms of K$_T$ is proportional to the fracture toughness K$_{IC}$, with a coefficient of proportionality of 1.78 when DOC/t is about 0.06, as is the case for the examples in FIG. 5. For this reason, a strengthened glass-based article is provided in some embodiments having a tensile-stress factor K$_T$ exceeding 1.3 MPa√m but not exceeding the value 1.78·K$_{IC}$. Such a glass-based article has greater fracture resistance than a glass-based article with a K$_T$ below 1.3 MPa√m, while remaining non-frangible. In some embodiments, the tensile-stress factor K$_T$ exceeds 1.4 MPa√m and does not exceed 1.78·K$_{IC}$.

In some embodiments, the glass-based article is characterized by a tensile-strain factor K$_T$ that exceeds 1.4 MPa√m and tensile-strain energy does not exceed a frangibility limit in terms of TSE given by:

$$TSE^{limit} = \frac{1-\nu}{E} 3.17 \cdot K_{IC}^2$$

By way of illustration, the frangibility limit in terms of TSE may be given by:

$$TSE^{limit}\left[\frac{J}{m^2}\right] = 37.5 \cdot K_{IC}^2$$

when the values for the Poisson's ratio and Young's modulus of composition 2 are substituted into the equation.

Figure 7:
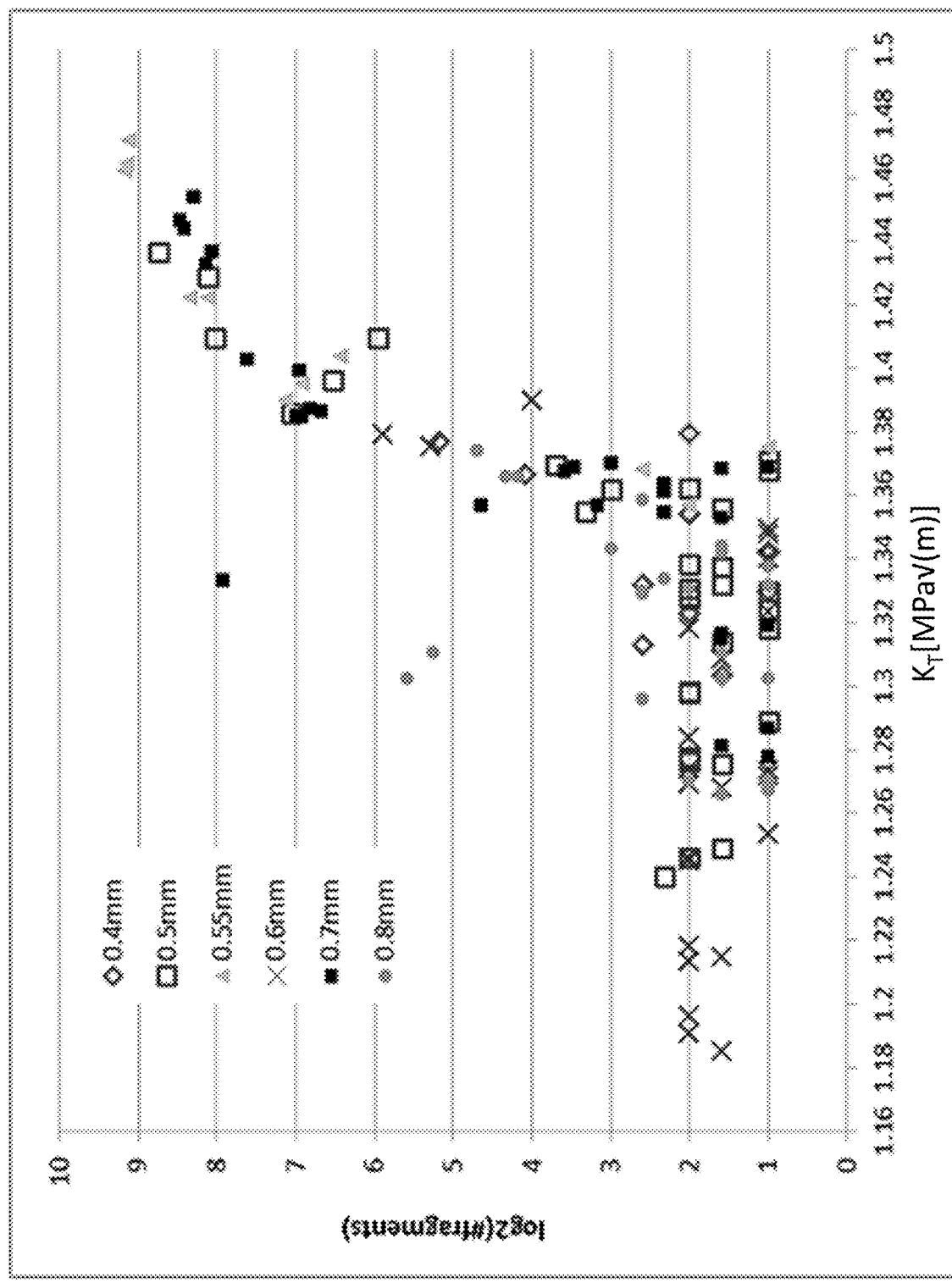
FIG. 7 is a plot of the number of fragments after fracture as a function of $K_T$ for samples of composition 2 with a variety of thicknesses and ion exchange treatments.

In embodiments, the frangibility limit of glass-based articles in terms of tensile-stress factor K$_T$ or the tensile-strain energy TSE depends on the ratio DOC/t, or, alternatively, on the ratio BTZ/t, e.g., breadth of the tension zone divided by the sheet thickness. BTZ may alternatively be indicated as DOC$_2$–DOC$_1$. FIG. 7 shows experimental data using 6 different thicknesses of 5 cm×5 cm square sheets of glass composition 2, chemically strengthened by long ion exchange in a bath having approximately 35% or 37% NaNO$_3$ and 65% or 63% KNO$_3$ by weight, at 450° C. for extended periods of time between about 13 hours and 24.5 hours. The horizontal axis of FIG. 7 shows the tensile-stress factor K$_T$ obtained from extraction of the stress profiles by the IWKB-method, while the vertical axis shows the logarithm with base 2 of the number of fragments for each fractured sample. A sample broken into 5 or more fragments will have logarithm higher than 2, and was considered frangible. The data for all thicknesses generally follow the same trend, except for a few outliers. These outliers are likely due to false positives, e.g., when the tip of the fracturing tool was dull or the sample had slight warp, each of which can promote the introduction of externally provided energy (potential or kinetic) by the fracturing tool to the sample. The data shown in FIG. 7 indicates that the critical value of the factor K$_T$ (and, correspondingly, of the TSE) does not depend substantially on the thickness. Furthermore, the critical value of K$_T$ for the strengthening conditions represented in FIG. 7 is significantly higher than that for the same composition 2 shown in FIG. 5. One substantial difference between the samples represented in FIG. 7 and the samples represented in FIG. 5 is the value of the ratio DOC/t. The samples in FIG. 5 were obtained by a relatively shallow ion exchange in mainly KNO$_3$ resulting in a stress profile with high surface CS around 800 MPa and a moderate DOC, such that the ratio DOC/t was about 0.058 for the parts of composition 2 that were at or near the frangibility limit. On the other hand, the samples represented in FIG. 7 were strengthened by a significantly deeper ion exchange with lower surface CS in the range 240-320 MPa, and a substantially higher DOC/t ratio, between about 0.13 and 0.21, with higher ratios obtained for the smaller thicknesses and vice-versa.

For each represented thickness in FIG. 7, the tension strain energy TSE and factor K$_T$ are increased by increasing the ion exchange time and the DOC/t ratio. In the reported range of $K_T$, the ratio DOC/t varied in a relatively narrow range for each thickness, 0.193-0.206 for t=0.4 mm, 0.161-0.179 for t=0.5 mm, 0.164-0.177 for t=0.55 mm, 0.143-0.161 for t=0.6 mm, 0.138-0.167 for t=0.7 mm, and 0.134-0.145 for t=0.8 mm. Non-frangible samples were observed at the following highest levels of $K_T$–1.379 MPa√m for t=0.4 mm, 1.37 MPa√m for t=0.5 mm, 1.375 MPa√m for t=0.55 mm, 1.36 MPa√m for t=0.6 mm, 1.37 MPa√m for t=0.7 mm, and 1.344 MPa√m for t=0.8 mm. Frangible samples were produced for each thickness at the following lowest levels of $K_T$–1.313 MPa√m for t=0.4 mm, 1.24 MPa√m for t=0.5 mm, 1.368 MPa√m for t=0.55 mm, 1.376 MPa√m for t=0.6 mm, 1.334 MPa√m for t=0.7 mm, and 1.296 MPa√m for t=0.8 mm. If data points that stand above the general trend are assigned as false positives and ignored, the lowest levels of $K_T$ for frangible parts with 8 or more fragments are: 1.366 MPa√m for t=0.4 mm, 1.355 MPa√m for t=0.5 mm, 1.368 MPa√m for t=0.55 mm, 1.376 MPa√m for t=0.6 mm, 1.357 MPa√m for t=0.7 mm, and 1.343 MPa√m for t=0.8 mm.

Figure 8:
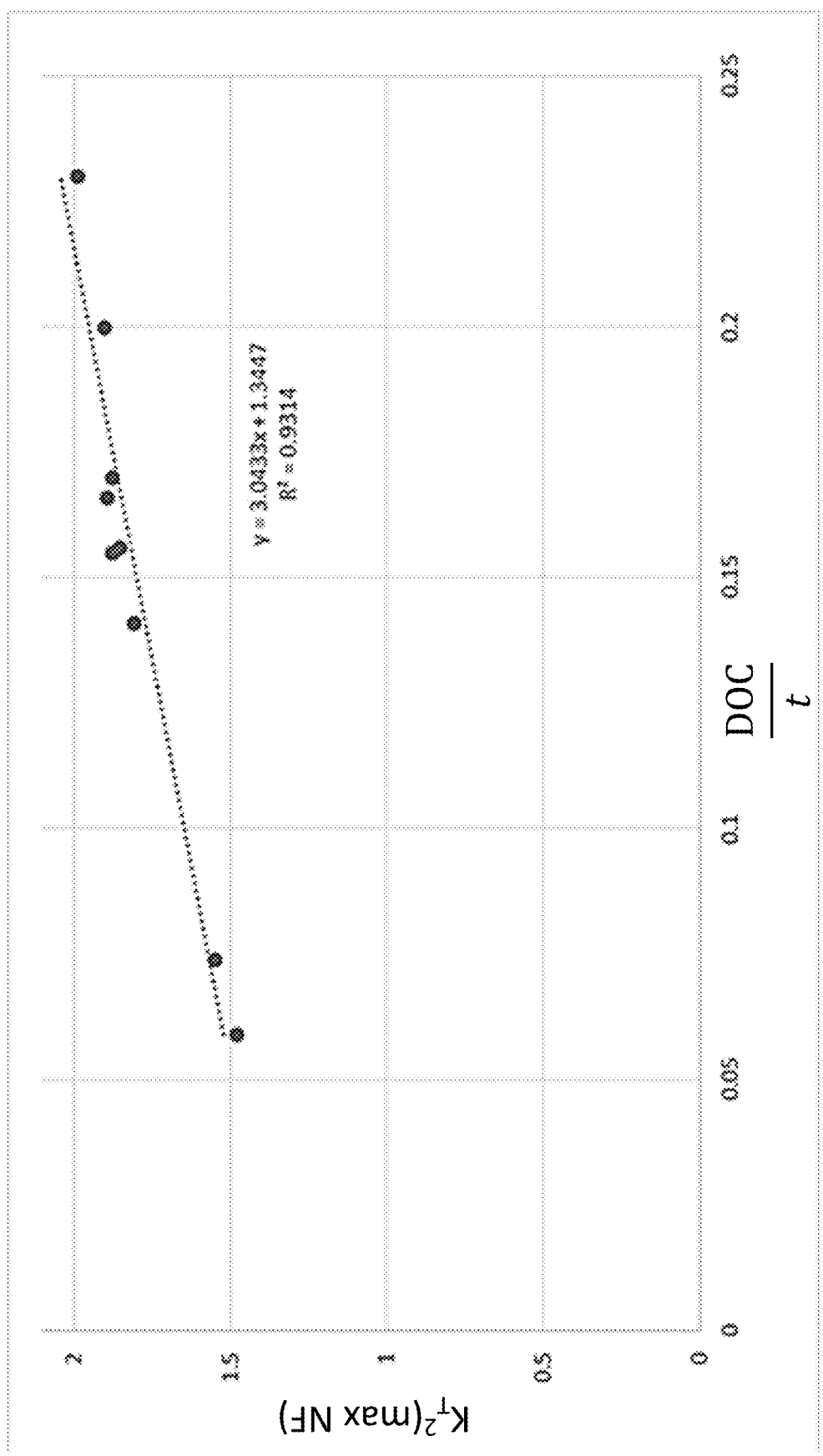
FIG. 8 is a plot of the square of the max non-frangible $K_T$ as a function of DOC/t for samples of composition 2.

The $K_T$ values of FIGS. 5 and 7 have been squared and combined with additional data for the same glass composition 2 obtained for the thickness of 0.4 mm and plotted in FIG. 8. The additional data includes a frangibility-limit estimate obtained for a very large ratio of DOC/t by heat treatment of frangible samples having a large ratio DOC/t above 0.2 until frangible behavior is no longer observed. Such samples were prepared by ion exchange in a bath having 35% $NaNO_3$ and 65% $KNO_3$ at 450° C. for between 14.4 and 16.5 hours, or in a bath having 17% $NaNO_3$ and 83% $KNO_3$, at 430° C. for 11.5 hours followed by 450° C. for 1.25 hours. The latter samples were highly frangible, but approached the frangibility limit after a heat treatment at 400° C. for 12 hours. The DOC increased to about 0.23 t after the heat treatment. The samples exchanged in the bath having the higher Na content required shorter heat treatment to return to a non-frangible state from the post-ion exchange frangible condition, as they had a lower $K_T$ value after ion exchange. The data in FIG. 8 for $K_T^2$ vs. DOC/t fits well to an empirical linear model which allowed the development of a precise empirical dependence of the frangibility-limit values for $K_T$ (and TSE) on the ratio DOC/t. In particular, for composition 2 the model gives:

$$K_T^2 limit = 1.3447 + 3.0443 \frac{DOC}{t} \text{ and:}$$

$$K_T limit = 1.16 \sqrt{1 + 2.263 \frac{DOC}{t}}$$

Based on these relationships, and taking into account that the fracture toughness $K_{IC}$ of composition 2 is 0.767 MPa√m, the following empirical general relationship between the frangibility-limit for $K_T$, the fracture toughness $K_{IC}$, and the ratio DOC/t is produced:

$$K_T limit = 1.716 \cdot K_{IC} \sqrt{1 + 2.263 \frac{DOC}{t}}$$

In some embodiments, this empirical general relationship for the frangibility-limit $K_T$ may be modified by a confidence factor (CF) as follows:

$$K_T limit = CF \cdot 1.716 \cdot K_{IC} \sqrt{1 + 2.263 \frac{DOC}{t}}$$

where the confidence factor (CF) may be given a value lower than 1, such as in the range of 0.9 to 0.95 when avoiding fragmented failure is of very high importance and the limited precision of instruments allows the determination of $K_T$ with a precision of only a few percent. A confidence factor (CF) with a value closer to 1, such as in the range of 0.95 to 1, would be appropriate when high-precision measurements of critical parameters of the stress profile allow the value of $K_T$ to be obtained with precision on the order of 1% or less.

Based on the relationship between TSE and $K_T$, the following limits can be equivalently applied to the TSE:

$$TSE^{limit} = \frac{1-\nu}{E} 2.94 (CF \cdot K_{IC})^2 \left(1 + 2.263 \frac{DOC}{t}\right)$$

For composition 2, the Poisson's ratio and the Young's modulus have values of 0.22 and 66 GPa, respectively. These values can be used to generate a general TSE limit given by the following:

$$TSE^{limit}\left(\frac{J}{m^2}\right) = 34.8 (CF \cdot K_{IC})^2 \left(1 + 2.263 \frac{DOC}{t}\right)$$

Figure 9:
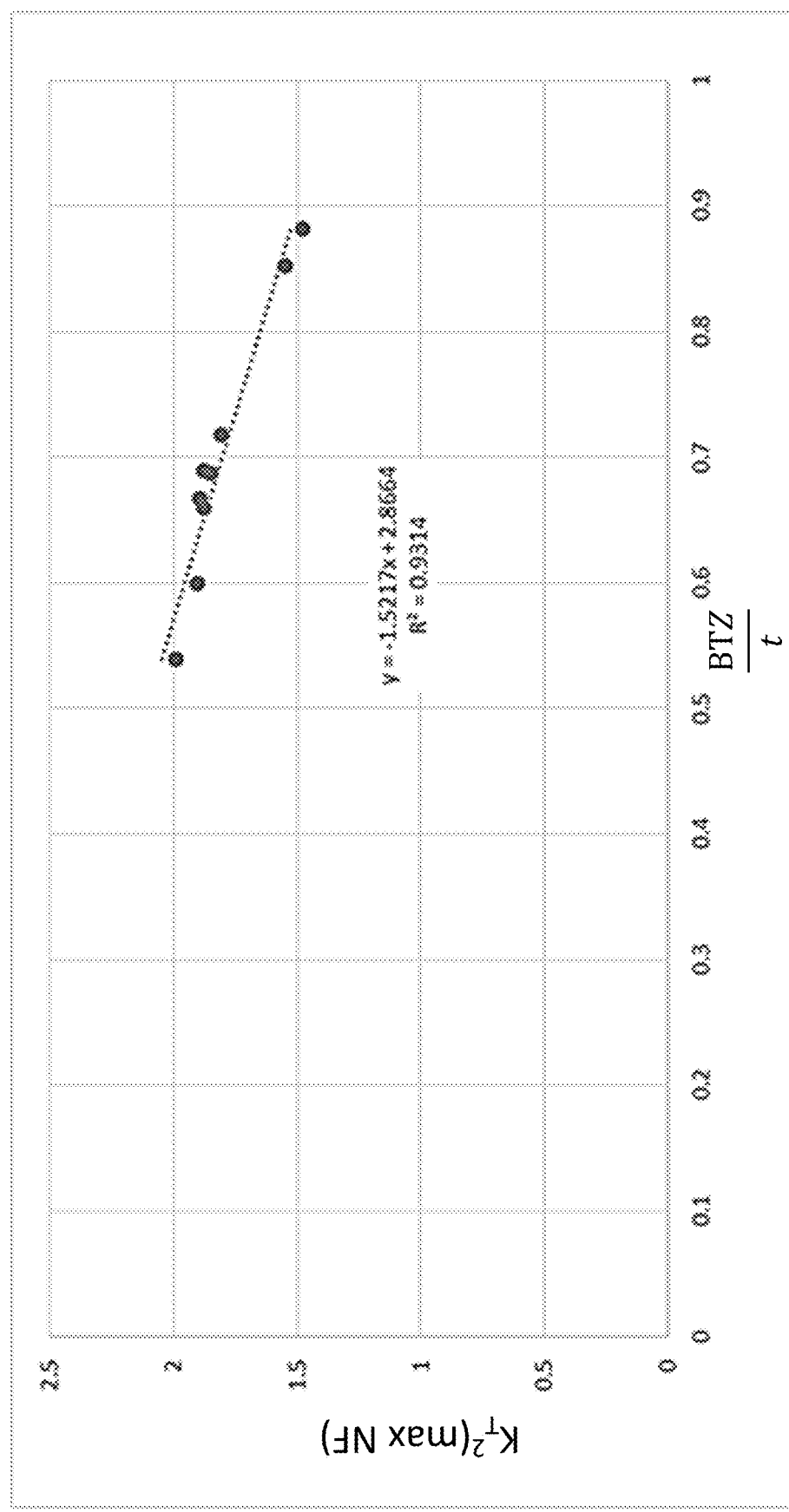
FIG. 9 is a plot of the data from FIG. 8 as a function of BTZ/t.

FIG. 9 shows the data of FIG. 8, as a function of BTZ/t in place of DOC/t. A linear fit of the frangibility limit value of $K_T^2$ as a function of BTZ/t for the composition 2 data was found, given by:

$$K_T^2 limit = 2.8664 - 1.5217 \frac{BTZ}{t} \text{ and:}$$

$$K_T^2 limit = 1.693 \sqrt{1 - 0.531 \frac{BTZ}{t}}$$

The use of BTZ allows this relationship to be applied to glass-based articles with asymmetrical stress profiles, such as stress profiles where $DOC_1$ is not equal to $DOC_2$ when measured from the first and second surfaces, respectively. When expressed in terms of the fracture toughness the relationship is:

$$K_T limit = CF \cdot 2.504 \cdot K_{IC} \sqrt{1 - 0.531 \frac{BTZ}{t}} \approx CF \cdot 2.5 \cdot K_{IC} \sqrt{1 - 0.531 \frac{BTZ}{t}}$$

The confidence factor (CF) may range from 0.85 to 1, and may be applied in the same way described above.

An associated TSE limit is given by:

$$TSE^{limit} = \frac{1-\nu}{E} 6.27 (CF \cdot K_{IC})^2 \left(1 - 0.531 \frac{BTZ}{t}\right)$$

In addition, the compressive stress factor $K_{CS}$ is equal to the square root of the integrated compressive stress over the compressive-stress regions on either side of the tensile-stress region, for a single component of the stress, x or y, as follows:

$$K_{CS,x} = \sqrt{\int_{CS_x>0} \sigma_x^2(z)dz}$$

$$K_{CS,y} = \sqrt{\int_{CS_y>0} \sigma_y^2(z)dz}$$

Or generally, for either component:

$$K_{CS} = \sqrt{\int_{CS>0} \sigma^2(z)dz}$$

In the case of a stress profile having two compressive regions extending on either side of a central tension region, from the first surface at z=0 to the first depth of compression $DOC_1$, and respectively on the second side from the second surface z=t to $DOC_2$, the compressive-stress factor takes the form:

$$K_{CS} = \sqrt{\int_{z=0}^{DOC_1} \sigma^2(z)dz + \int_{t-DOC_2}^{t} \sigma^2(z)dz}$$

For symmetric stress profiles, where $DOC_1=DOC_2$ when measured from the first and second surfaces, respectively, and with a symmetric stress distribution, the compressive stress factor is given by:

$$K_{CS} = \sqrt{2\int_{z=0}^{DOC} \sigma^2(z)dz}$$

A compressive stress energy value of the glass-based articles may be described by:

$$CSE = \frac{1-v}{2E}(K_{CS,x}^2 + K_{CS,y}^2)$$

which may be simplified when $K_{CS,x}=K_{CS,y}=K_{CS}$ to:

$$CSE = \frac{1-v}{E}K_{CS}^2$$

The apparent increase in frangibility limit in terms of $K_T$ was correlated not only with the ratio DOC/t, but also with the relative magnitude of TSE and CSE. In particular, with an increase of the ratio DOC/t the TSE comprised a larger fraction of the total strain energy (TSE+CSE) stored in the glass-based article as the result of chemical strengthening. Tables 4 and 5 include a summary of the data for samples produced with composition 2 and various thicknesses and stress profiles.

TABLE 4

| | | IOX Conditions | | | Stress | | | | | | | | |
|---|---|---|---|---|---|---|---|---|---|---|---|---|---|
| Sample | Thickness (mm) | Bath Content (wt %) | Temperature (° C.) | Time (hours) | CS (MPa) | $DOL_K$ (μm) | DOC (μm) | CT (MPa) | Integral (MPa · μm) | Average Tension (MPa) | DOC/t | BTZ/t | I/t (MPa) |
| A | 0.4 | 37% NaNO$_3$ 63% KNO$_3$ | 450 | 16 | 239 | 160 | 82.6 | 116.2 | 19520 | 82.8 | 0.2 | 0.6 | 48.7 |
| B | 0.5 | 35% NaNO$_3$ 65% KNO$_3$ | 450 | 14.5 | 294 | 144 | 85.5 | 96.2 | 23675.3 | 72 | 0.17 | 0.66 | 47.4 |
| C | 0.55 | 35% NaNO$_3$ 65% KNO$_3$ | 450 | 13.5 | 297 | 148 | 90.7 | 80.2 | 25298.8 | 68.6 | 0.166 | 0.668 | 46 |
| D | 0.6 | 35% NaNO$_3$ 65% KNO$_3$ | 450 | 15.75 | 304.5 | 147 | 93.4 | 73.1 | 26418 | 64.1 | 0.156 | 0.688 | 44.1 |
| E | 0.7 | 37% NaNO$_3$ 63% KNO$_3$ | 450 | 20 | 278.5 | 175 | 108.7 | 68.85 | 28990 | 59.7 | 0.155 | 0.69 | 41.2 |
| F | 0.8 | 37% NaNO$_3$ 63% KNO$_3$ | 450 | 23 | 298 | 173 | 113.2 | 54.3 | 31376 | 54.3 | 0.141 | 0.718 | 39 |
| G | 0.8 | 1.5% NaNO$_3$ 98.5% KNO$_3$ | 390 | 3 | 813 | 56 | 48 | 46.3 | 31944 | 45.5 | 0.059 | 0.882 | 40 |
| H | 0.4 | 17% NaNO$_3$ 83% KNO$_3$ | 430 | 11.5 | 160 | 172 | 91 | 119 | 19500 | 89.9 | 0.23 | 0.54 | 48.9 |
| I | 0.4 | 100% KNO$_3$ | 390 | 1.3 | 930 | 36 | 29.2 | 67 | 22300 | 65.3 | 0.074 | 0.852 | 55.8 |

TABLE 5

| | A | B | C | D | E | F | G | H | I |
|---|---|---|---|---|---|---|---|---|---|
| $K_T$ (MPa√m) | 1.379 | 1.37 | 1.375 | 1.35 | 1.37 | 1.344 | 1.215 | 1.418 | 1.244 |
| TSE (J/m$^2$) | 22.5 | 22.2 | 22.3 | 21.5 | 22.2 | 21.3 | 17.4 | 23.8 | 18.3 |

TABLE 5-continued

|  | A | B | C | D | E | F | G | H | I |
|---|---|---|---|---|---|---|---|---|---|
| $K_T^2$ (MPa²m) | 1.903 | 1.878 | 1.892 | 1.823 | 1.877 | 1.806 | 1.476 | 2.01 | 1.548 |
| $K_{CS}^2$ (MPa²m) | 2.952 | 4.283 | 4.635 | 4.924 | 5.056 | 5.737 | 16.8 | 2.51 | 12.97 |
| $K_{Tn}^2$ (MPa²m) | 4.163 | 4.109 | 4.139 | 3.988 | 4.107 | 3.953 | 3.23 | 4.398 | 3.388 |
| $K_{CSn}^2$ (MPa²m) | 6.46 | 9.372 | 10.142 | 10.775 | 11.064 | 12.554 | 36.763 | 5.493 | 28.382 |
| $K_T^2 + (K_{CS}^2/28.5)$ (MPa²m) | 2.006 | 2.028 | 2.054 | 1.995 | 2.054 | 2.008 | 2.066 | 2.098 | 2.003 |
| $K_{Tn}^2 + (K_{CSn}^2/28.5)$ (MPa²m) | 4.39 | 4.438 | 4.495 | 4.366 | 4.495 | 4.393 | 4.52 | 4.591 | 4.384 |

Figure 10:
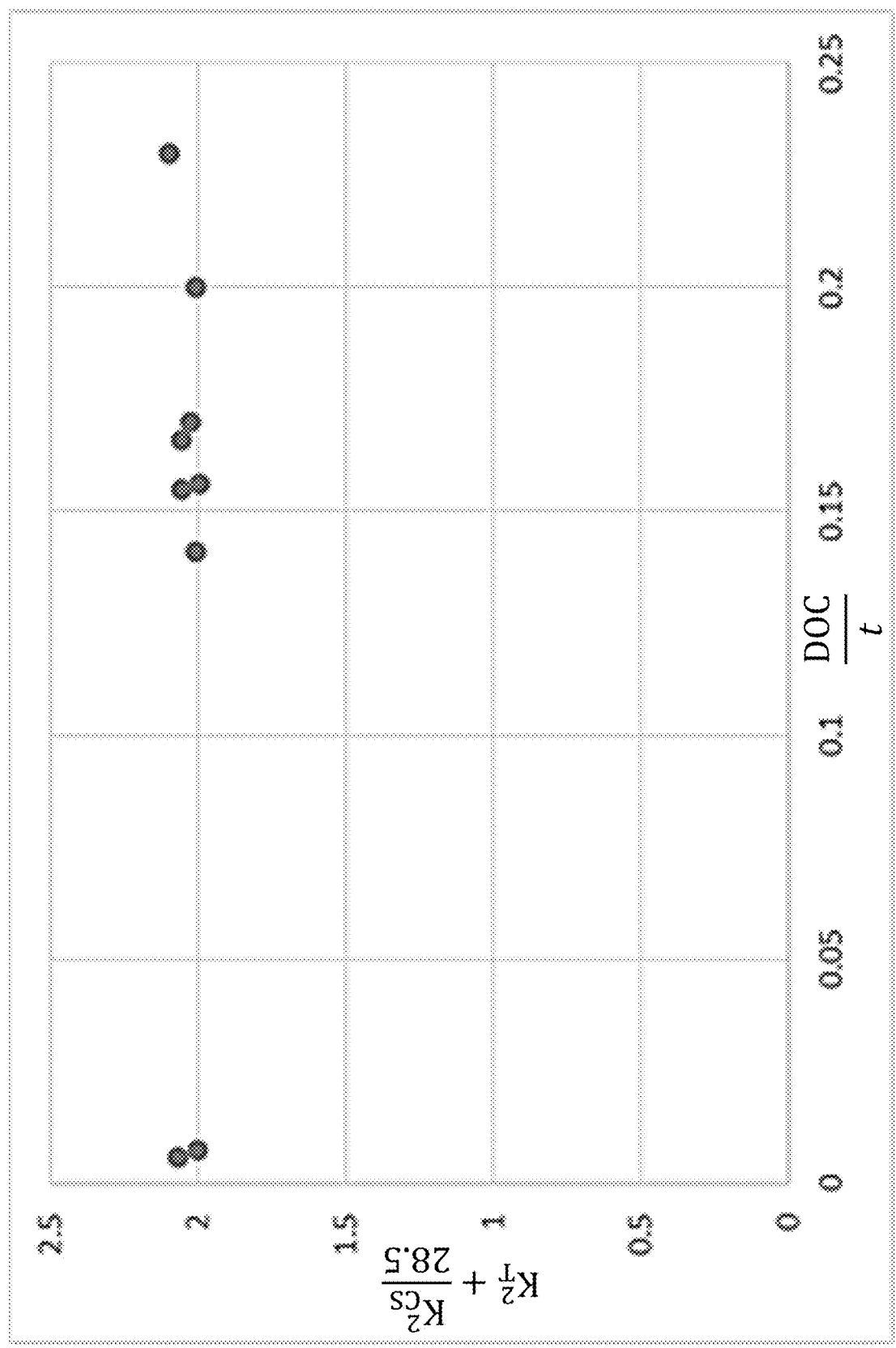
FIG. 10 is a plot of the data from FIGS. 7 and 8 after combination with data on the integral of the squared stress in the compressive stress regions, where $K_T$ and $K_{CS}$ are tensile and compressive stress factors, respectively.

TSE is proportional to $K_T^2$, while CSE is proportional to $K_{CS}^2$. For the experiments with composition 2 it was determined that at the frangibility limit condition a specific sum of the squared factors $K_T$ and $K_{CS}$ normalized to the fracture toughness is substantially unchanged regardless of the ratio DOC/t. FIG. 10 shows that for glass composition 2 the sum of $K_T^2$ and $K_{CS}^2/28.5$ is constant at the frangibility limit for the tested range of the ratio DOC/t:

$$K_T^2 + \frac{K_{CS}^2}{28.5} = 2.03 \pm 0.04 \text{ MPa}^2\text{m}$$

This includes non-frangible examples having $K_T$ as low as 1.215 MPa√m, and as high as 1.418 MPa√m, and additional examples at 1.244 MPa√m, 1.344 MPa√m, 1.35 MPa√m, 1.37 MPa√m, 1.375 MPa√m, and 1.379 MPa√m. Hence, in embodiments, a glass article having $K_T$ greater than or equal to 1.2 MPa√m, also satisfies the condition $$K_T^2 + \frac{K_{CS}^2}{28.5} = 2.03 \text{ MPa}^2\text{m}$$

In embodiments, the glass-based article has a $K_T$ greater than or equal to 1.24 MPa√m, 1.3 MPa√m, 1.34 MPa√m, 1.36 MPa√m, 1.37 MPa√m, 1.4 MPa√m, or 1.41 MPa√m. Furthermore, in some embodiments $K_T$ does not exceed 2.2 $K_{IC}$, 2.1 $K_{IC}$, 2.0 $K_{IC}$, 1.9 $K_{IC}$, 1.8 $K_{IC}$, or 1.78 $K_{IC}$, where $K_{IC}$ is the fracture toughness of the glass, or the local glass composition in the location having the highest tension (usually the mid-plane of the glass sheet).

Figure 11:
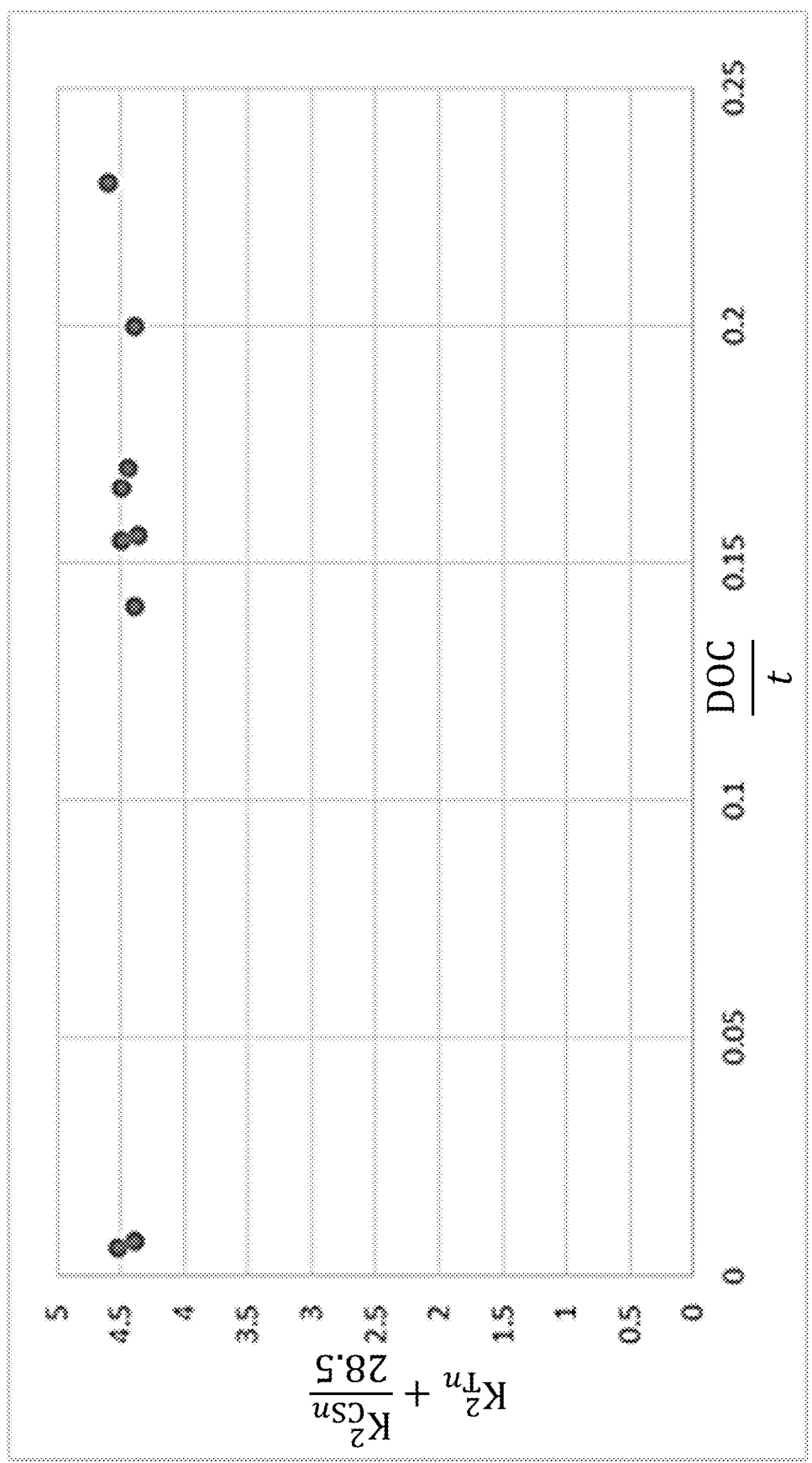
FIG. 11 is a plot of the data from FIGS. 7 and 8 after combination with data on the integral of the squared stress in the compressive stress regions, where $K_{Tn}$ and $K_{CSn}$ are tensile and compressive stress factors, respectively, normalized to the fracture toughness.

Taking into account that the fracture toughness of composition 2 is 0.676 MPa√m, the data of FIG. 10 are presented in FIG. 11 where the weighted contributions of $K_T^2$ and $K_{CS}^2$ have been normalized to the square of fracture toughness. Then to avoid frangibility:

$$K_T^2 + \frac{K_{CS}^2}{28.5} \leq 4.45 K_{IC}^2$$

or:

$$\frac{K_T^2}{K_{IC}^2} + \frac{1}{28.5}\frac{K_{CS}^2}{K_{IC}^2} \leq 4.45$$

In terms of the normalized values where $K_{Tn}=K_T/K_{IC}$ and $K_{CSn}=K_{CS}/K_{IC}$ presented in FIG. 11, the condition may be further simplified to:

$$K_{Tn}^2 + \frac{K_{CSn}^2}{28.5} \leq 4.45$$

In embodiments, a glass-based article having $K_T$ greater than or equal to 1.31 MPa√m, also satisfies the condition:

$$K_T^2 + \frac{K_{CS}^2}{28.5} \leq 4.45 K_{IC}^2$$

More conservative criteria may also be employed, such as:

$$K_T^2 + \frac{K_{CS}^2}{28.5} \leq 4.1 K_{IC}^2$$

or:

$$K_T^2 + \frac{K_{CS}^2}{28.5} \leq 3.8 K_{IC}^2$$

In embodiments, $K_T$ is greater than or equal to 1.2 MPa√m, such as greater than or equal to 1.24 MPa√m, greater than or equal to 1.3 MPa√m, greater than or equal to 1.31 MPa√m, greater than or equal to 1.34 MPa√m, greater than or equal to 1.36 MPa√m, greater than or equal to 1.37 MPa√m, greater than or equal to 1.4 MPa√m, greater than or equal to 1.41 MPa√m, greater than or equal to 1.43 MPa√m, greater than or equal to 1.44 MPa√m, greater than or equal to 1.45 MPa√m, greater than or equal to 1.46 MPa√m, greater than or equal to 1.47 MPa√m, greater than or equal to 1.48 MPa√m, greater than or equal to 1.49 MPa√m, greater than or equal to 1.50 MPa√m, greater than or equal to 1.51 MPa√m, greater than or equal to 1.52 MPa√m, greater than or equal to 1.53 MPa√m, greater than or equal to 1.54 MPa√m, greater than or equal to 1.55 MPa√m, greater than or equal to 1.56 MPa√m, greater than or equal to 1.57 MPa√m, greater than or equal to 1.58 MPa√m, greater than or equal to 1.59 MPa√m, greater than or equal to 1.60 MPa√m, greater than or equal to 1.7 MPa√m, greater than or equal to 1.8 MPa√m, greater than or equal to 1.9 MPa√m, or greater than or equal to 2 MPa√m. In some embodiments $K_T$ does not exceed 2.2 $K_{IC}$, such as being less than or equal to 2.1 $K_{IC}$, less than or equal to 2.0 $K_{IC}$, less than or equal to 1.9 $K_{IC}$, less than or equal to 1.8 $K_{IC}$, less than or equal to 1.78 $K_{IC}$, less than or equal to 1.75 $K_{IC}$, less than or equal to 1.7 $K_{IC}$, less than or equal to 1.65 $K_{IC}$, or less.

In some embodiments, the CS of the glass-based article is from greater than or equal to 300 MPa to less than or equal to 1300 MPa, such as from greater than or equal to 325 MPa to less than or equal to 1250 MPa, from greater than or equal to 350 MPa to less than or equal to 1200 MPa, from greater than or equal to 375 MPa to less than or equal to 1150 MPa, from greater than or equal to 400 MPa to less than or equal to 1100 MPa, from greater than or equal to 425 MPa to less than or equal to 1050 MPa, from greater than or equal to 450 MPa to less than or equal to 1000 MPa, from greater than or equal to 475 MPa to less than or equal to 975 MPa, from greater than or equal to 500 MPa to less than or equal to 950 MPa, from greater than or equal to 525 MPa to less than or equal to 925 MPa, from greater than or equal to 550 MPa to less than or equal to 900 MPa, from greater than or equal to 575 MPa to less than or equal to 875 MPa, from greater than or equal to 600 MPa to less than or equal to 850 MPa, from greater than or equal to 625 MPa to less than or equal to 825 MPa, from greater than or equal to 650 MPa to less than or equal to 800 MPa, from greater than or equal to 675 MPa to less than or equal to 775 MPa, or from greater than or equal to 700 MPa to less than or equal to 750 MPa, and all ranges and sub-ranges between the foregoing values. In some embodiments, the CS of the glass-based article is greater than or equal to 100 MPa.

The $DOL_K$ is typically less than the DOC for the articles described herein. The $DOL_K$ of each of first and second compressive layers 120, 122 is from greater than or equal to 5 μm to less than or equal to 30 μm, such as from greater than or equal to 6 μm to less than or equal to 25 μm, from greater than or equal to 7 μm to less than or equal to 20 μm, from greater than or equal to 8 μm to less than or equal to 15 μm, or from greater than or equal to 9 μm to less than or equal to 10 μm, and all ranges and sub-ranges between the foregoing values. In other embodiments, the $DOL_K$ of each of the first and second compressive layers 120, 122 is from greater than or equal to 6 μm to less than or equal to 30 μm, such as from greater than or equal to 10 μm to less than or equal to 30 μm, from greater than or equal to 15 μm to less than or equal to 30 μm, from greater than or equal to 20 μm to less than or equal to 30 μm, or from greater than or equal to 25 μm to less than or equal to 30 μm, and all ranges and sub-ranges between the foregoing values. In yet other embodiments, the $DOL_K$ of each of the first and second compressive layers 120, 122 is from greater than or equal to 5 μm to less than or equal to 25 μm, such as from greater than or equal to 5 μm to less than or equal to 20 μm, from greater than or equal to 5 μm to less than or equal to 15 μm, or from greater than or equal to 5 μm to less than or equal to 10 μm, and all ranges and sub-ranges between the foregoing values.

In embodiments, the glass-based article may have a maximum CT greater than or equal to 70 MPa, such as greater than or equal to 75 MPa, greater than or equal to 80 MPa, greater than or equal to 85 MPa, greater than or equal to 90 MPa, greater than or equal to 95 MPa, greater than or equal to 100 MPa, greater than or equal to 105 MPa, greater than or equal to 110 MPa, greater than or equal to 110 MPa, greater than or equal to 120 MPa, greater than or equal to 130 MPa, greater than or equal to 140 MPa, greater than or equal to 150 MPa, greater than or equal to 155 MPa, or more. In some embodiments, the glass-based article may have a maximum CT less than or equal to 400 MPa, such as less than or equal to 350 MPa, less than or equal to 300 MPa, less than or equal to 250 MPa, less than or equal to 190 MPa, less than or equal to 180 MPa, less than or equal to 170 MPa, less than or equal to 160 MPa, less than or equal to 150 MPa, less than or equal to 140 MPa, less than or equal to 130 MPa, less than or equal to 120 MPa, less than or equal to 110 MPa, or less than or equal to 100 MPa. It should be understood that, in embodiments, any of the above ranges may be combined with any other range. However, in other embodiments, the glass article may have a maximum CT from greater than or equal to 70 MPa to less than or equal to 400 MPa, such as from greater than or equal to 90 MPa to less than or equal to 350 MPa, from greater than or equal to 110 MPa to less than or equal to 200 MPa, from greater than or equal to 120 MPa to less than or equal to 180 MPa, from greater than or equal to 130 MPa to less than or equal to 160 MPa, or from greater than or equal to 140 MPa to less than or equal to 150 MPa, and all ranges and sub-ranges between the foregoing values.

In embodiments, the maximum central tension (CT) may also be described with reference to the thickness of the glass-based article. In embodiments, the glass-based article may have a maximum CT less than or equal to $360/\sqrt{(t)}$ MPa where t is in mm, such as less than or equal to $350/\sqrt{(t)}$ MPa, less than or equal to $330/\sqrt{(t)}$ MPa, less than or equal to $310/\sqrt{(t)}$ MPa, less than or equal to $300/\sqrt{(t)}$ MPa, less than or equal to $280/\sqrt{(t)}$ MPa, less than or equal to $260/\sqrt{(t)}$ MPa, less than or equal to $240/\sqrt{(t)}$ MPa, less than or equal to $220/\sqrt{(t)}$ MPa, less than or equal to $200/\sqrt{(t)}$ MPa, less than or equal to $190/\sqrt{(t)}$ MPa, less than or equal to $180/\sqrt{(t)}$ MPa, less than or equal to $170/\sqrt{(t)}$ MPa, less than or equal to $160/\sqrt{(t)}$ MPa, less than or equal to $150/\sqrt{(t)}$ MPa, less than or equal to $140/\sqrt{(t)}$ MPa, less than or equal to $130/\sqrt{(t)}$ MPa, less than or equal to $120/\sqrt{(t)}$ MPa, less than or equal to $110/\sqrt{(t)}$ MPa, less than or equal to $100/\sqrt{(t)}$ MPa, less than or equal to $90/\sqrt{(t)}$ MPa, less than or equal to $80/\sqrt{(t)}$ MPa, less than or equal to $70/\sqrt{(t)}$ MPa, or less. In embodiments, the glass-based article may have a maximum CT greater than or equal to $60/\sqrt{(t)}$ MPa where t is in mm, such as greater than or equal to $70/\sqrt{(t)}$ MPa, greater than or equal to $80/\sqrt{(t)}$ MPa, greater than or equal to $90/\sqrt{(t)}$ MPa, greater than or equal to $100/\sqrt{(t)}$ MPa, greater than or equal to $110/\sqrt{(t)}$ MPa, greater than or equal to $120/\sqrt{(t)}$ MPa, greater than or equal to $130/\sqrt{(t)}$ MPa, greater than or equal to $140/\sqrt{(t)}$ MPa, greater than or equal to $150/\sqrt{(t)}$ MPa, greater than or equal to $160/\sqrt{(t)}$ MPa, greater than or equal to $170/\sqrt{(t)}$ MPa, greater than or equal to $180/\sqrt{(t)}$ MPa, greater than or equal to $190/\sqrt{(t)}$ MPa, greater than or equal to $200/\sqrt{(t)}$ MPa, greater than or equal to $220/\sqrt{(t)}$ MPa, greater than or equal to $240/\sqrt{(t)}$ MPa, greater than or equal to $260/\sqrt{(t)}$ MPa, greater than or equal to $280/\sqrt{(t)}$ MPa, greater than or equal to $300/\sqrt{(t)}$ MPa, greater than or equal to $320/\sqrt{(t)}$ MPa, greater than or equal to $340/\sqrt{(t)}$ MPa, greater than or equal to $350/\sqrt{(t)}$ MPa, or more. In embodiments, the glass-based article may have a maximum CT from greater than or equal to $60/\sqrt{(t)}$ MPa to less than or equal to $360/\sqrt{(t)}$ MPa where t is in mm, such as from greater than or equal to $70/\sqrt{(t)}$ MPa to less than or equal to $350/\sqrt{(t)}$ MPa, from greater than or equal to $80/\sqrt{(t)}$ MPa to less than or equal to $340/\sqrt{(t)}$ MPa, from greater than or equal to $90/\sqrt{(t)}$ MPa to less than or equal to $320/\sqrt{(t)}$ MPa, from greater than or equal to $90/\sqrt{(t)}$ MPa to less than or equal to $300/\sqrt{(t)}$ MPa, from greater than or equal to $100/\sqrt{(t)}$ MPa to less than or equal to $280/\sqrt{(t)}$ MPa, from greater than or equal to $120/\sqrt{(t)}$ MPa to less than or equal to $260/\sqrt{(t)}$ MPa, from greater than or equal to $140/\sqrt{(t)}$ MPa to less than or equal to $240/\sqrt{(t)}$ MPa, from greater than or equal to $160/\sqrt{(t)}$ MPa to less than or equal to $220/\sqrt{(t)}$ MPa, from greater than or equal to $180/\sqrt{(t)}$ MPa to less than or equal to $200/\sqrt{(t)}$ MPa, and all ranges and sub-ranges between the foregoing values.

The glass-based articles may have any appropriate depth of compression (DOC). In embodiments, the DOC is from greater than or equal to 75 µm to less than or equal to 300 µm, such as from greater than or equal to 85 µm to less than or equal to 290 µm, from greater than or equal to 95 µm to less than or equal to 280 µm, from greater than or equal to 100 µm to less than or equal to 270 µm, from greater than or equal to 110 µm to less than or equal to 260 µm, from greater than or equal to 120 µm to less than or equal to 250 µm, from greater than or equal to 130 µm to less than or equal to 240 µm, from greater than or equal to 140 µm to less than or equal to 230 µm, from greater than or equal to 150 µm to less than or equal to 220 µm, from greater than or equal to 160 µm to less than or equal to 210 µm, from greater than or equal to 170 µm to less than or equal to 200 µm, from greater than or equal to 180 µm to less than or equal to 190 µm, and all ranges and sub-ranges between the foregoing values.

The DOC is provided in some embodiments herein as a portion of the thickness (t) of the glass-based article. In embodiments, the glass articles may have a depth of compression (DOC) from greater than or equal to 0.15 t to less than or equal to 0.40 t, such as from greater than or equal to 0.18 t to less than or equal to 0.38 t, or from greater than or equal to 0.19 t to less than or equal to 0.36 t, from greater than or equal to 0.20 t to less than or equal to 0.34 t, from greater than or equal to 0.18 t to less than or equal to 0.32 t, from greater than or equal to 0.19 t to less than or equal to 0.30 t, from greater than or equal to 0.20 t to less than or equal to 0.29 t, from greater than or equal to 0.21 t to less than or equal to 0.28 t, from greater than or equal to 0.22 t to less than or equal to 0.27 t, from greater than or equal to 0.23 t to less than or equal to 0.26 t, or from greater than or equal to 0.24 t to less than or equal to 0.25 t, and all ranges and sub-ranges between the foregoing values.

In embodiments, the glass-based articles may be characterized by any appropriate value of DOC/t. For example, DOC/t may be greater than or equal to 0.12, such as greater than or equal to 0.13, greater than or equal to 0.14, greater than or equal to 0.15, greater than or equal to 0.16, greater than or equal to 0.17, greater than or equal to 0.18, greater than or equal to 0.19, greater than or equal to 0.20, greater than or equal to 0.21, greater than or equal to 0.22, greater than or equal to 0.23, or more.

The glass-based articles may be formed by exposing glass-based substrates to an ion exchange solution to form a glass-based article having a compressive stress layer extending from a surface of the glass-based article to a depth of compression. The ion exchange process may be conducted under conditions sufficient to produce a glass-based article satisfying any of the frangibility limits described herein. In embodiments, the ion exchange solution may be molten nitrate salt. In some embodiments, the ion exchange solution may be molten $KNO_3$, molten $NaNO_3$, or combinations thereof. In certain embodiments, the ion exchange solution may comprise less than about 95% molten $KNO_3$, such as less than about 90% molten $KNO_3$, less than about 80% molten $KNO_3$, less than about 70% molten $KNO_3$, less than about 60% molten $KNO_3$, or less than about 50% molten $KNO_3$. In certain embodiments, the ion exchange solution may comprise at least about 5% molten $NaNO_3$, such as at least about 10% molten $NaNO_3$, at least about 20% molten $NaNO_3$, at least about 30% molten $NaNO_3$, or at least about 40% molten $NaNO_3$. In other embodiments, the ion exchange solution may comprise about 95% molten $KNO_3$ and about 5% molten $NaNO_3$, about 94% molten $KNO_3$ and about 6% molten $NaNO_3$, about 93% molten $KNO_3$ and about 7% molten $NaNO_3$, about 80% molten $KNO_3$ and about 20% molten $NaNO_3$, about 75% molten $KNO_3$ and about 25% molten $NaNO_3$, about 70% molten $KNO_3$ and about 30% molten $NaNO_3$, about 65% molten $KNO_3$ and about 35% molten $NaNO_3$, or about 60% molten $KNO_3$ and about 40% molten $NaNO_3$, and all ranges and sub-ranges between the foregoing values. In embodiments, other sodium and potassium salts may be used in the ion exchange solution, such as, for example sodium or potassium nitrites, phosphates, or sulfates. In some embodiments, the ion exchange solution may include lithium salts, such as $LiNO_3$.

The glass-based substrate may be exposed to the ion exchange solution by dipping the glass-based substrate into a bath of the ion exchange solution, spraying the ion exchange solution onto the glass-based substrate, or otherwise physically applying the ion exchange solution to the glass-based substrate. Upon exposure to the glass-based substrate, the ion exchange solution may, according to embodiments, be at a temperature from greater than or equal to 340° C. to less than or equal to 500° C., such as from greater than or equal to 350° C. to less than or equal to 490° C., from greater than or equal to 360° C. to less than or equal to 480° C., from greater than or equal to 370° C. to less than or equal to 470° C., from greater than or equal to 380° C. to less than or equal to 460° C., from greater than or equal to 390° C. to less than or equal to 450° C., from greater than or equal to 400° C. to less than or equal to 440° C., from greater than or equal to 410° C. to less than or equal to 430° C., equal to 420° C., and all ranges and sub-ranges between the foregoing values. In embodiments, the glass composition may be exposed to the ion exchange solution for a duration from greater than or equal to 2 hours to less than or equal to 48 hours, such as from greater than or equal to 4 hours to less than or equal to 44 hours, from greater than or equal to 8 hours to less than or equal to 40 hours, from greater than or equal to 12 hours to less than or equal to 36 hours, from greater than or equal to 16 hours to less than or equal to 32 hours, from greater than or equal to 20 hours to less than or equal to 28 hours, equal to 24 hours, and all ranges and sub-ranges between the foregoing values.

The ion exchange process may be performed in an ion exchange solution under processing conditions that provide an improved compressive stress profile as disclosed, for example, in U.S. Patent Application Publication No. 2016/0102011, which is incorporated herein by reference in its entirety. In some embodiments, the ion exchange process may be selected to form a parabolic stress profile in the glass articles, such as those stress profiles described in U.S. Patent Application Publication No. 2016/0102014, which is incorporated herein by reference in its entirety.

After an ion exchange process is performed, it should be understood that a composition at the surface of the glass-based article is different than the composition of the glass-based substrate before it undergoes an ion exchange process. This results from one type of alkali metal ion in the as-formed glass, such as, for example $Li^+$ or $Na^+$, being replaced with larger alkali metal ions, such as, for example $Na^+$ or $K^+$, respectively. However, the glass composition at or near the center of the depth of the glass article will, in embodiments, still have the composition of the glass-based substrate.

The glass-based substrates that are ion exchanged to form the glass-based articles may have any appropriate composition, such as alkali aluminosilicate compositions. In embodiments, the glass-based substrates include $SiO_2$, $Al_2O_3$, $B_2O_3$, and at least one alkali metal oxide. The at least one alkali metal oxide facilitates the ion exchange of the glass-based substrates. For example, the glass-based substrate may include $Li_2O$ and/or $Na_2O$ that facilitate the exchange of Na⁺ and K⁺ ions into the glass-based substrate to form the glass-based articles. As discussed above, the composition of the glass-based substrates may be equivalent to the composition at the center of the glass-based article.

In embodiments of glass-based substrates described herein, the concentration of constituent components (e.g., $SiO_2$, $Al_2O_3$, $Li_2O$, and the like) are given in mole percent (mol %) on an oxide basis, unless otherwise specified. Components of the glass-based substrate according to embodiments are discussed individually below. It should be understood that any of the variously recited ranges of one component may be individually combined with any of the variously recited ranges for any other component.

In embodiments of the glass-based substrates disclosed herein, $SiO_2$ is the largest constituent and, as such, $SiO_2$ is the primary constituent of the glass network formed from the glass composition. Pure $SiO_2$ has a relatively low CTE and is alkali free. However, pure $SiO_2$ has a high melting point. Accordingly, if the concentration of $SiO_2$ in the glass-based substrate is too high, the formability of the glass composition may be diminished as higher concentrations of $SiO_2$ increase the difficulty of melting the glass, which, in turn, adversely impacts the formability of the glass. In embodiments, the glass-based substrate generally comprises $SiO_2$ in an amount from greater than or equal to 50.0 mol % to less than or equal to 75.0 mol %, and all ranges and sub-ranges between the foregoing values. In embodiments, the glass-based substrate comprises $SiO_2$ in an amount from greater than or equal to 51.0 mol % to less than or equal to 74.0 mol %, such as from greater than or equal to 52.0 mol % to less than or equal to 73.0 mol %, from greater than or equal to 53.0 mol % to less than or equal to 72.0 mol %, from greater than or equal to 54.0 mol % to less than or equal to 71.0 mol %, from greater than or equal to 55.0 mol % to less than or equal to 70.0 mol %, from greater than or equal to 56.0 mol % to less than or equal to 69.0 mol %, from greater than or equal to 57.0 mol % to less than or equal to 68.0 mol %, from greater than or equal to 58.0 mol % to less than or equal to 67.0 mol %, from greater than or equal to 60.0 mol % to less than or equal to 66.0 mol %, from greater than or equal to 61.0 mol % to less than or equal to 65.0 mol %, from greater than or equal to 62.0 mol % to less than or equal to 64.0 mol %, from greater than or equal to 63.0 mol % to less than or equal to 64.0 mol %, and all ranges and sub-ranges between the foregoing values.

The glass-based substrate of embodiments may further comprise $Al_2O_3$. $Al_2O_3$ may serve as a glass network former, similar to $SiO_2$. $Al_2O_3$ may increase the viscosity of the glass composition due to its tetrahedral coordination in a glass melt formed from a glass composition, decreasing the formability of the glass composition when the amount of $Al_2O_3$ is too high. However, when the concentration of $Al_2O_3$ is balanced against the concentration of $SiO_2$ and the concentration of alkali oxides in the glass-based substrate, $Al_2O_3$ can reduce the liquidus temperature of the glass melt, thereby enhancing the liquidus viscosity and improving the compatibility of the glass composition with certain forming processes, such as the fusion forming process. In embodiments, the glass-based substrate generally comprises $Al_2O_3$ in a concentration of from greater than or equal to 4 mol % to less than or equal to 25.0 mol %, and all ranges and sub-ranges between the foregoing values. In embodiments, the glass-based substrate comprises $Al_2O_3$ in an amount from greater than or equal to 5.0 mol % to less than or equal to 24.5 mol %, such as from greater than or equal to 6 mol % to less than or equal to 24.0 mol %, from greater than or equal to 7 mol % to less than or equal to 23.5 mol %, from greater than or equal to 8 mol % to less than or equal to 23.0 mol %, from greater than or equal to 9 mol % to less than or equal to 22.5 mol %, from greater than or equal to 10 mol % to less than or equal to 22.0 mol %, from greater than or equal to 11 mol % to less than or equal to 21.5 mol %, from greater than or equal to 12 mol % to less than or equal to 21.0 mol %, from greater than or equal to 13 mol % to less than or equal to 20.5 mol %, from greater than or equal to 14 mol % to less than or equal to 20.0 mol %, from greater than or equal to 15 mol % to less than or equal to 19.5 mol %, or from greater than or equal to 16 mol % to less than or equal to 19.0 mol %, and all ranges and sub-ranges between the foregoing values.

Like $SiO_2$ and $Al_2O_3$, $B_2O_3$ may be added to the glass-based substrate as a network former, thereby reducing the meltability and formability of the glass composition. Thus, $B_2O_3$ may be added in amounts that do not overly decrease these properties. In embodiments, the glass-based substrate may comprise $B_2O_3$ in amounts from greater than or equal to 0 mol % $B_2O_3$ to less than or equal to 8.0 mol % $B_2O_3$, and all ranges and sub-ranges between the foregoing values. In embodiments, the glass-based substrate comprises $B_2O_3$ in amounts from greater than or equal to 0.5 mol % to less than or equal to 7.5 mol %, such as greater than or equal to 1.0 mol % to less than or equal to 7.0 mol %, greater than or equal to 1.5 mol % to less than or equal to 6.5 mol %, greater than or equal to 2.0 mol % to less than or equal to 6.0 mol %, greater than or equal to 2.5 mol % to less than or equal to 5.5 mol %, greater than or equal to 3.0 mol % to less than or equal to 5.0 mol %, or greater than or equal to 3.5 mol % to less than or equal to 4.5 mol %, and all ranges and sub-ranges between the foregoing values.

The inclusion of $Li_2O$ in the glass-based substrate allows for better control of an ion exchange process and further reduces the softening point of the glass, thereby increasing the manufacturability of the glass. In embodiments, the glass-based substrate generally comprises $Li_2O$ in an amount from greater than 8.0 mol % to less than or equal to 18.0 mol %, and all ranges and sub-ranges between the foregoing values. In embodiments, the glass-based substrate comprises $Li_2O$ in an amount from greater than or equal to 8.5 mol % to less than or equal to 17.5 mol %, such as from greater than or equal to 9.0 mol % to less than or equal to 17.0 mol %, from greater than or equal to 9.5 mol % to less than or equal to 16.5 mol %, from greater than or equal to 10.0 mol % to less than or equal to 16.0 mol %, from greater than or equal to 10.5 mol % to less than or equal to 15.5 mol %, from greater than or equal to 11.0 mol % to less than or equal to 15.0 mol %, from greater than or equal to 11.5 mol % to less than or equal to 14.5 mol %, from greater than or equal to 12.0 mol % to less than or equal to 14.0 mol %, or from greater than or equal to 12.5 mol % to less than or equal to 13.5 mol %, and all ranges and sub-ranges between the foregoing values. In some embodiments, the glass-based substrate may be substantially free or free of $Li_2O$.

According to embodiments, the glass-based substrate may comprise alkali metal oxides other than or in addition to $Li_2O$, such as $Na_2O$. $Na_2O$ aids in the ion exchangeability of the glass composition, and also improves the formability, and thereby manufacturability, of the glass composition. However, if too much $Na_2O$ is added to the glass-based substrate, the CTE may be too low, and the melting point may be too high. In embodiments, the glass-based substrate generally comprises $Na_2O$ in an amount from greater than or equal to 0.5 mol % $Na_2O$ to less than or equal to 20.0 mol % $Na_2O$, and all ranges and sub-ranges between the foregoing values. In embodiments, the glass-based substrate comprises Na$_2$O in an amount from greater than or equal to 1.0 mol % to less than or equal to 18 mol %, such as from greater than or equal to 1.5 mol % to less than or equal to 16 mol %, from greater than or equal to 2.0 mol % to less than or equal to 14 mol %, from greater than or equal to 2.5 mol % to less than or equal to 12 mol %, from greater than or equal to 3.0 mol % to less than or equal to 10 mol %, from greater than or equal to 3.5 mol % to less than or equal to 8 mol %, or from greater than or equal to 4.0 mol % to less than or equal to 6 mol %, and all ranges and sub-ranges between the foregoing values. In some embodiments, the glass-based substrate may be substantially free or free of Na$_2$O.

Like Na$_2$O, K$_2$O also promotes ion exchange and increases the DOC of a compressive stress layer. However, adding K$_2$O may cause the CTE may be too low, and the melting point may be too high. In some embodiment, the glass-based substrate can include K$_2$O. In embodiments, the glass composition is substantially free of potassium. As used herein, the term "substantially free" means that the component is not added as a component of the batch material even though the component may be present in the final glass in very small amounts as a contaminant, such as less than 0.01 mol %. In other embodiments, K$_2$O may be present in the glass-based substrate in amounts less than 1 mol %.

MgO lowers the viscosity of a glass, which enhances the formability and manufacturability of the glass. The inclusion of MgO in the glass-based substrate also improves the strain point and the Young's modulus of the glass composition, and may also improve the ion exchange ability of the glass. However, when too much MgO is added to the glass composition, the density and the CTE of the glass composition increase undesirably. In embodiments, the glass-based substrate generally comprises MgO in a concentration of from greater than or equal to 0 mol % to less than or equal to 17.5 mol %, and all ranges and sub-ranges between the foregoing values. In embodiments, the glass-based substrate comprises MgO in an amount from greater than or equal to 0.5 mol % to less than or equal to 17.0 mol %, such as from greater than or equal to 1.0 mol % to less than or equal to 16.5 mol %, from greater than or equal to 1.5 mol % to less than or equal to 16.0 mol %, from greater than or equal to 2.0 mol % to less than or equal to 15.5 mol %, from greater than or equal to 2.5 mol % to less than or equal to 15.0 mol %, from greater than or equal to 3.0 mol % to less than or equal to 14.5 mol %, from greater than or equal to 3.5 mol % to less than or equal to 14.0 mol %, from greater than or equal to 4.0 mol % to less than or equal to 13.5 mol %, from greater than or equal to 4.5 mol % to less than or equal to 13.0 mol %, from greater than or equal to 5.0 mol % to less than or equal to 12.5 mol %, from greater than or equal to 5.5 mol % to less than or equal to 12.0 mol %, from greater than or equal to 6.0 mol % to less than or equal to 11.5 mol %, from greater than or equal to 6.5 mol % to less than or equal to 11.0 mol %, from greater than or equal to 7.0 mol % to less than or equal to 10.5 mol %, from greater than or equal to 7.5 mol % to less than or equal to 10.0 mol %, from greater than or equal to 8.0 mol % to less than or equal to 9.5 mol %, or from greater than or equal to 8.5 mol % to less than or equal to 9.0 mol %, and all ranges and sub-ranges between the foregoing values.

CaO lowers the viscosity of a glass, which enhances the formability, the strain point and the Young's modulus, and may improve the ion exchange ability. However, when too much CaO is added to the glass-based substrate, the density and the CTE of the glass composition increase. In embodiments, the glass-based substrate generally comprises CaO in a concentration of from greater than or equal to 0 mol % to less than or equal to 4.0 mol %, and all ranges and sub-ranges between the foregoing values. In embodiments, the glass-based substrate comprises CaO in an amount from greater than or equal to 0.5 mol % to less than or equal to 3.5 mol %, such as from greater than or equal to 1.0 mol % to less than or equal to 3.0 mol %, or from greater than or equal to 1.5 mol % to less than or equal to 2.5 mol %, and all ranges and sub-ranges between the foregoing values.

TiO$_2$ also contributes to the increased toughness of the glass, while also simultaneously softening the glass. However, when too much TiO$_2$ is added to the glass composition, the glass becomes susceptible to devitrification and exhibits an undesirable coloration. In embodiments, the glass-based substrate comprises TiO$_2$, such as in a concentration of from greater than or equal to 0 mol % to less than or equal to 2.0 mol %, and all ranges and sub-ranges between the foregoing values. In embodiments, the glass-based substrate comprises TiO$_2$ in an amount from greater than or equal to 0.5 mol % to less than or equal to 1.5 mol %. In some embodiments, the glass-based substrate is free or substantially free of TiO$_2$.

ZrO$_2$ contributes to the toughness of the glass. However, when too much ZrO$_2$ is added to the glass composition, undesirable zirconia inclusions may be formed in the glass due at least in part to the low solubility of ZrO$_2$ in the glass. In embodiments, the glass-based substrate comprises ZrO$_2$, such as in a concentration of from greater than or equal to 0 mol % to less than or equal to 2.5 mol %, and all ranges and sub-ranges between the foregoing values. In embodiments, the glass-based substrate comprises ZrO$_2$ in an amount from greater than or equal to 0.5 mol % to less than or equal to 2.0 mol %, such as from greater than or equal to 1.0 mol % to less than or equal to 1.5 mol %, and all ranges and sub-ranges between the foregoing values. In some embodiments, the glass-based substrate is free or substantially free of ZrO$_2$.

SrO lowers the liquidus temperature of glass compositions disclosed herein. In embodiments, the glass-based substrate may comprise SrO in amounts from greater than or equal to 0 mol % to less than or equal to 2.0 mol %, such as from greater than or equal to 0.2 mol % to less than or equal to 1.5 mol %, or from greater than or equal to 0.4 mol % to less than or equal to 1.0 mol %, and all ranges and sub-ranges between the foregoing values. In some embodiments, the glass-based substrate may be substantially free or free of SrO.

In embodiments, the glass-based substrate may optionally include one or more fining agents. In some embodiments, the fining agents may include, for example, SnO$_2$. In such embodiments, SnO$_2$ may be present in the glass-based substrate in an amount less than or equal to 0.2 mol %, such as from greater than or equal to 0 mol % to less than or equal to 0.1 mol %, and all ranges and sub-ranges between the foregoing values. In other embodiments, SnO$_2$ may be present in the glass-based substrate in an amount from greater than or equal to 0 mol % to less than or equal to 0.2 mol %, or greater than or equal to 0.1 mol % to less than or equal to 0.2 mol %, and all ranges and sub-ranges between the foregoing values. In some embodiments, the glass-based substrate may be substantially free or free of SnO$_2$.

In embodiments, the glass-based substrate may be substantially free of one or both of arsenic and antimony. In other embodiments, the glass-based substrate may be free of one or both of arsenic and antimony.

In one or more embodiments, the glass-based articles described herein may exhibit an amorphous microstructure and may be substantially free of crystals or crystallites. In other words, the glass-based articles may exclude glass ceramic materials in some embodiments.

The glass-based substrate may include a glass ceramic. The glass ceramic may include any appropriate crystal structure, such as lithium silicate, beta-spodumene, or spinel crystal structures. The glass ceramic containing glass-based substrates may be formed by any appropriate method, such as ceramming a precursor glass.

The glass-based substrates may be produced by any appropriate method. In embodiments, the glass-based substrates may be formed by process including slot forming, float forming, rolling processes, and fusion forming processes. Drawing processes for forming glass-based substrates, are desirable because they allow a thin glass article to be formed with few defects.

The glass-based substrates may be characterized by the manner in which it may be formed. For instance, the glass-based substrate may be characterized as float-formable (i.e., formed by a float process), down-drawable and, in particular, fusion-formable or slot-drawable (i.e., formed by a down draw process such as a fusion draw process or a slot draw process).

Some embodiments of the glass-based articles described herein may be formed by a down-draw process. Down-draw processes produce glass-based substrates having a uniform thickness that possess relatively pristine surfaces. Because the average flexural strength of the glass-based substrate and resulting glass-based article is controlled by the amount and size of surface flaws, a pristine surface that has had minimal contact has a higher initial strength. In addition, down drawn glass-based substrates have a very flat, smooth surface that can be used in its final application without costly grinding and polishing.

Some embodiments of the glass-based substrates may be described as fusion-formable (i.e., formable using a fusion draw process). The fusion process uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass article. The fusion draw method offers the advantage that, because the two glass films flowing over the channel fuse together, neither of the outside surfaces of the resulting glass-based substrate comes in contact with any part of the apparatus. Thus, the surface properties of the fusion drawn glass-based substrate are not affected by such contact.

Some embodiments of the glass-based substrates described herein may be formed by a slot draw process. The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous glass-based substrate and into an annealing region.

Figure 12A:
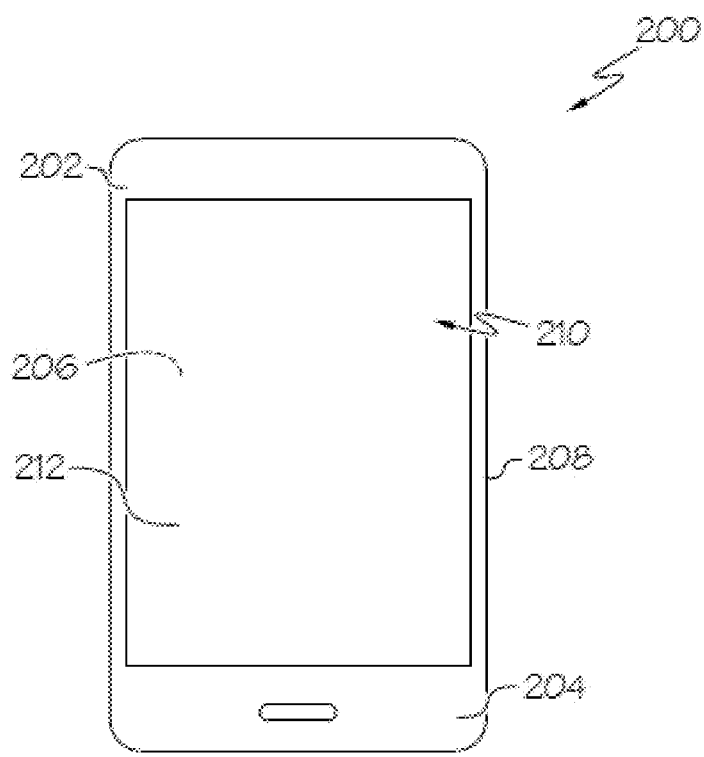
FIG. 12A is a plan view of an exemplary electronic device incorporating any of the glass-based articles disclosed herein.
Figure 12B:
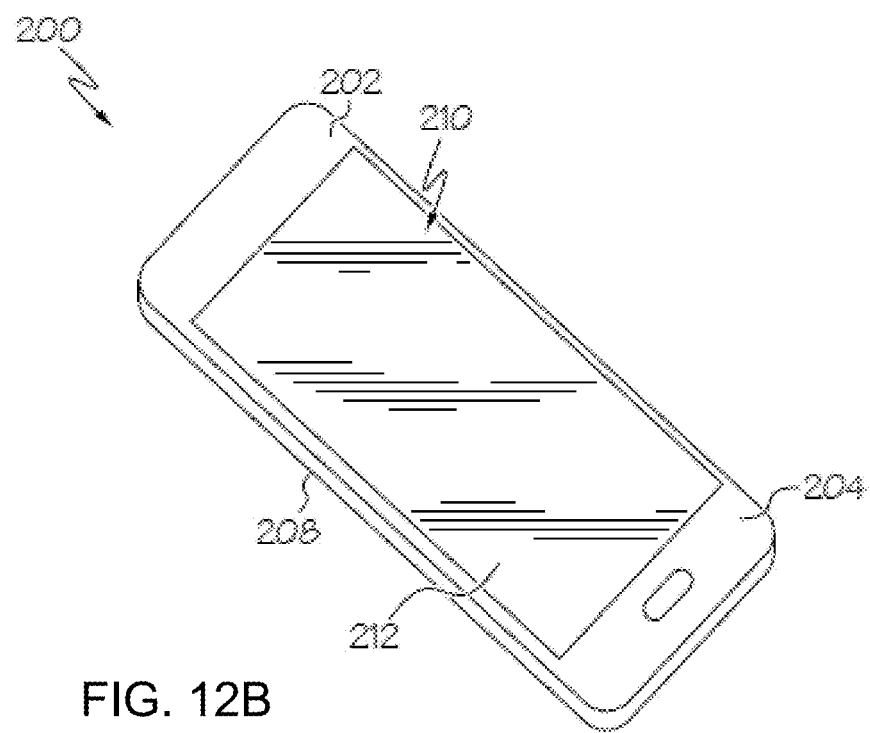
FIG. 12B is a perspective view of the exemplary electronic device of FIG. 12A.

The glass-based articles disclosed herein may be incorporated into another article such as an article with a display (or display articles) (e.g., consumer electronics, including mobile phones, tablets, computers, navigation systems, and the like), architectural articles, transportation articles (e.g., automobiles, trains, aircraft, sea craft, etc.), appliance articles, or any article that requires some transparency, scratch-resistance, abrasion resistance or a combination thereof. An exemplary article incorporating any of the glass-based articles disclosed herein is shown in FIGS. 12A and 12B. Specifically, FIGS. 12A and 12B show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover substrate 212 at or over the front surface of the housing such that it is over the display. The cover substrate 212 and/or the housing may include any of the glass-based articles disclosed herein.

All ranges disclosed in this specification include any and all ranges and subranges encompassed by the broadly disclosed ranges whether or not explicitly stated before or after a range is disclosed.

It will be apparent to those skilled in the art that various modifications and variations can be made to the embodiments described herein without departing from the spirit and scope of the claimed subject matter. Thus, it is intended that the specification cover the modifications and variations of the various embodiments described herein provided such modification and variations come within the scope of the appended claims and their equivalents.

What is claimed is:

1. A method, comprising:
    exposing a glass-based substrate to an ion exchange solution to form a glass-based article;
    wherein the glass-based article comprises:
        a first surface;
        a second surface; and
        a stress profile having a first compressive region extending from a first surface to a first depth of compression $DOC_1$, a second compressive region extending from a second surface to a second depth of compression $DOC_2$, and a tensile region extending from $DOC_1$ to $DOC_2$,
        wherein the tensile region has a tensile stress factor $K_T$ greater than or equal to 1.31 MPa·√(m) and less than 1.8·$K_{IC}$, wherein $K_{IC}$ is the fracture toughness of the glass-based substrate.

2. The method of claim 1, wherein $K_T$ is greater than or equal to 1.41 MPa·√(m).

3. The method of claim 1, wherein $K_T$ is less than or equal to 1.781·$K_{IC}$.

4. The method of claim 1, wherein $K_{IC}$ is greater than or equal to 0.73 MPa·√(m).

5. The method of claim 1, wherein $DOC_1 = DOC_2$, as measured from the first and second surfaces, respectively.

6. The method of claim 1, wherein the glass-based article is non-frangible.

7. A method, comprising:
    exposing a glass-based substrate to an ion exchange solution to form a glass-based article;
    wherein the glass-based article comprises:
        a surface; and
        a stress profile having a compressive region extending from a surface to a depth of compression DOC, and a tensile region,
        wherein the tensile region has a tensile stress factor $K_T$ greater than or equal to 1.31 MPa·√(m) and less than or equal to $K_T^{limit}$, where $K_T^{limit}$ is defined by:

$$K_T^{limit} = 1.716 \cdot K_{IC}\sqrt{1 + 2.263\frac{DOC}{t}}$$

wherein $K_{IC}$ is the fracture toughness of the glass-based substrate and t is the thickness of the glass-based article.

8. The method of claim 7, wherein $K_T$ is greater than or equal to 1.41 MPa·√(m).

9. The method of claim 7, wherein $$\frac{DOC}{t}$$

is greater than 0.12.

10. The method of claim 7, wherein $K_{IC}$ is greater than or equal to 0.67 MPa·√(m).

11. The method of claim 7, wherein the glass-based article is non-frangible.

12. A method, comprising:
exposing a glass-based substrate to an ion exchange solution to form a glass-based article;
wherein the glass-based article comprises:
a first surface;
a second surface; and
a stress profile having a first compressive region extending from a first surface to a first depth of compression $DOC_1$, a second compressive region extending from a second surface to a second depth of compression $DOC_2$, and a tensile region extending from $DOC_1$ to $DOC_2$,
wherein the tensile region has a tensile stress factor $K_T$ greater than or equal to 1.31 MPa·√(m) and less than or equal to $K_T^{limit}$, where $K_T^{limit}$ is defined by:

$$K_T^{limit} = 2.504 \cdot K_{IC}\sqrt{1 - 0.531\frac{|DOC_1 - DOC_2|}{t}}$$

wherein $K_{IC}$ is the fracture toughness of the glass-based substrate, t is the thickness of the glass-based article, and the $DOC_1$ and the $DOC_2$ are measured from the first surface.

13. The method of claim 12, wherein $K_T$ is greater than or equal to 1.41 MPa·√(m).

14. The method of claim 12, wherein $K_T$ is less than or equal to $0.95 \cdot K_T^{limit}$.

15. The method of claim 12, wherein $K_{IC}$ is greater than or equal to 0.67 MPa·√(m).

16. The method of claim 12, wherein $DOC_1 = t - DOC_2$.

17. The method of claim 12, wherein the glass-based article is non-frangible.

18. A method, comprising:
exposing a glass-based substrate to an ion exchange solution to form a glass-based article;
wherein the glass-based article comprises:
a surface; and
a stress profile having a compressive region extending from a surface to a depth of compression DOC, and a tensile region,
wherein the compressive region has a compressive-stress factor $K_{CS}$, the tensile region has a tensile stress factor $K_T$ greater than or equal to 1.31 MPa·√(m), and:

$$\frac{K_T^2}{K_{IC}^2} + \frac{1}{28.5}\frac{K_{CS}^2}{K_{IC}^2} \leq 4.45$$

wherein $K_{IC}$ is the fracture toughness of the glass-based substrate.

19. The method of claim 18, wherein:

$$\frac{K_T^2}{K_{IC}^2} + \frac{1}{28.5}\frac{K_{CS}^2}{K_{IC}^2} \leq 4.1.$$

20. The method of claim 18, wherein $K_T$ is greater than or equal to 1.41 MPa·√(m).

21. The method of claim 18, wherein the glass-based article is non-frangible.

* * * * *